US008330700B2

(12) United States Patent
Yamanaka et al.

(10) Patent No.: US 8,330,700 B2
(45) Date of Patent: Dec. 11, 2012

(54) DRIVING CIRCUIT AND DRIVING METHOD OF ACTIVE MATRIX DISPLAY DEVICE, AND ACTIVE MATRIX DISPLAY DEVICE

(75) Inventors: Shigeru Yamanaka, Funabashi (JP); Ryuichi Hirayama, Musashimurayama (JP); Ken Yoshino, Sayama (JP)

(73) Assignee: Casio Computer Co., Ltd., Tokyo (JP)

( * ) Notice: Subject to any disclaimer, the term of this patent is extended or adjusted under 35 U.S.C. 154(b) by 506 days.

(21) Appl. No.: 12/075,729

(22) Filed: Mar. 13, 2008

(65) Prior Publication Data

US 2008/0238898 A1 Oct. 2, 2008

(30) Foreign Application Priority Data

Mar. 29, 2007 (JP) ................................ 2007-089664
Aug. 10, 2007 (JP) ................................ 2007-210328

(51) Int. Cl.
*G09G 3/36* (2006.01)
*G11C 19/00* (2006.01)

(52) U.S. Cl. ............... 345/100; 345/98; 345/99; 377/68

(58) Field of Classification Search .................. 345/204, 345/87, 98–100; 377/64, 66, 68
See application file for complete search history.

(56) References Cited

U.S. PATENT DOCUMENTS 6,075,505 A 6/2000 Shiba et al.
6,075,507 A 6/2000 Miyahara et al.
6,259,504 B1 7/2001 Shin et al.
6,552,707 B1 4/2003 Fujiyoshi
2001/0043180 A1 11/2001 Mori et al.
2004/0183768 A1 * 9/2004 Yamato et al. .................. 345/98
2004/0196232 A1 10/2004 Kim et al.
2005/0168424 A1 8/2005 Nakamoto et al.
2005/0225545 A1 * 10/2005 Takatori et al. ............... 345/204
(Continued)

FOREIGN PATENT DOCUMENTS

JP 5-265045 A 10/1993
(Continued)

OTHER PUBLICATIONS

Japanese Office Action (and English translation thereof) dated Sep. 24, 2008, issued in a Japanese Application corresponding to related U.S. Appl. No. 11/904,637.

(Continued)

*Primary Examiner* — Sumati Lefkowitz
*Assistant Examiner* — Jonathan Horner
(74) *Attorney, Agent, or Firm* — Holtz, Holtz, Goodman & Chick, PC

(57) ABSTRACT

In an active matrix display device, one source line is arranged for every two pixels arranged along a gate line direction, and each two pixels which are adjacent to each other along the gate line direction across one of the source lines share the source line and are each connected to different gate lines. A gate driver block performs a first driving control which sequentially selects, in a first order, the gate lines in a pair of two gate lines corresponding to two pixels which are adjacent to each other along the gate line direction and are connected to different source lines. The gate driver block also performs a second driving control which sequentially selects, in a second order which is opposite to the first order, the gate lines in such a pair of two gate lines.

11 Claims, 28 Drawing Sheets

U.S. PATENT DOCUMENTS

| | | | |
|---|---|---|---|
| 2005/0231455 A1 | 10/2005 | Moon | |
| 2005/0243044 A1 * | 11/2005 | Kang et al. | 345/87 |
| 2007/0053586 A1 | 3/2007 | Makino | |

FOREIGN PATENT DOCUMENTS

| | | | |
|---|---|---|---|
| JP | 8-201769 A | | 8/1996 |
| JP | 8-320674 A | | 12/1996 |
| JP | 10-73843 A | | 3/1998 |
| JP | 10-171412 A | | 6/1998 |
| JP | 11-295759 A | | 10/1999 |
| JP | 11-326869 A | | 11/1999 |
| JP | 2002-258813 A | | 9/2002 |
| JP | 2004-185006 A | | 7/2004 |
| JP | 2005-202377 A | | 7/2005 |
| JP | 2005-309437 A | | 11/2005 |
| KR | 2005-0101672 A | | 10/2005 |
| WO | WO 2006/018800 A1 | * | 2/2006 |

OTHER PUBLICATIONS

Korean Office Action (and English translation thereof) dated Sep. 10, 2008, issued in a Korean Application corresponding to related U.S. Appl. No. 11/904,637.

Related U.S. Appl. No. 11/904,637, filed Sep. 27, 2007; Inventor: Ryuichi Hirayama; Title: Active Matrix Type Display Device and Driving Method Thereof.

Chinese Office Action dated Feb. 5, 2010 and English translation thereof in counterpart Chinese Application No. 2008101003389.

Japanese Office Action dated Jan. 20, 2009 (2 pages), and English translation thereof (3 pages) issued in counterpart Japanese Application No. 2006-268950.

Chinese Office Action dated Aug. 4, 2010 (and English translation thereof) in counterpart Chinese Application No. 200810100338.9.

* cited by examiner

DRIVING CIRCUIT AND DRIVING METHOD OF ACTIVE MATRIX DISPLAY DEVICE, AND ACTIVE MATRIX DISPLAY DEVICE

CROSS-REFERENCE TO RELATED APPLICATIONS

This application is based upon and claims the benefit of priority from prior Japanese Patent Applications No. 2007-89664, filed Mar. 29, 2007, and No. 2007-210328, filed Aug. 10, 2007, the entire contents of both of which are incorporated herein by reference.

BACKGROUND OF THE INVENTION

1. Field of the Invention

The present invention relates to a driving circuit and a driving method of an active matrix display device in which two adjacent pixels share one signal line, and to an active matrix display device using such a driving circuit.

2. Description of the Related Art

In recent years, an active matrix type display device using a thin-film transistor (TFT) as a switching element has been developed.

The display device includes a scanning line driving circuit (gate driver) which generates scanning signals in order to scan, in turn by row, a plurality of pixels arranged in a matrix form. The gate driver operates at an operation frequency lower than that of a source driver (signal line driving circuit) which supplies video signals to each of the pixels. Therefore, even if the gate driver is formed at the same time in the same process as the process to form TFTs corresponding to each of the pixels, the gate driver can satisfy its specification.

Each pixel of the display device has a pixel electrode connected to a TFT, and a common electrode (common to all of the pixels) to which a common voltage Vcom is applied. In the active matrix type display device, to prevent deterioration of liquid crystals caused by sustained application of an electric field in one direction, inversion driving to invert polarities of a video signal Vsig from the source driver against the common voltage Vcom for each frame, line or dot has been performed generally.

Meanwhile, in mounting the display device, the gate driver and the source driver are disposed around a display panel (display screen), which has a large number of pixels disposed thereon. Wiring lines to electrically connect scanning lines (gate lines), and signal lines (source lines) on the display screen to the gate driver and the source driver are routed around the outside the display screen. At this time, it is strongly desired to make a routing area of the wiring lines smaller, that is, to achieve a reduction in area other than the display panel (i.e., to narrow the picture frame) from a point of view of miniaturizing information equipment having an active matrix display device built-in.

Therefore, in particular, a configuration of pixel wiring lines with half the number of source lines has been developed because the area occupied by the source lines can be made smaller, in order to narrow the picture frames of the display panel in the vertical direction (e.g., as shown in FIG. 5 of Jpn. Pat. Appln. KOKAI Publication No. 2004-185006).

FIG. 19 is a schematic view of an example of pixel wiring lines on a display screen to achieve such a narrowed picture frame. This example shares one source line with two adjacent pixels 200. In this case, TFTs 202 of the two adjacent pixels 200 (in the same row) are connected to respective different gate lines. In FIG. 19, for example, the TFT 202 of the pixel 200 in red (R) at the upper left is connected to a gate line G1 and a source line S1, and the TFT 202 of the neighboring pixel 200 in green (G) to the right is connected to a gate line G2 and the source line S1.

FIG. 20 illustrates a timing chart consisting of the output order of combinations of video signals Vsigs based on the information to be output on a plurality of source lines S1, S2, S3, . . . , and to be displayed, and of the selection order of a plurality of gate lines G1, G2, G3, . . . , in such pixel wire connection lines. As shown in FIG. 20, since the number of the gate lines G1, G2, G3, . . . , is twice of the number of rows of pixels, in the plurality of gate lines G1, G2, G3, one gate line will be selected (will become an H signal) for each half horizontal period (½ H) in accordance with the selection order. The combination of each video signal Vsig to be written in pixels 200 corresponding to the selected gate line is output at one time to a plurality of source lines S1, S2, S3, . . . , during a half horizontal period. For instance, during a half horizontal period in which the gate line G1 is selected, combination "S-1" of video signals Vsigs is output to the plurality of source lines S1, S2, S3, . . . , and in a half horizontal period in which the next gate line G2 is selected, combination "S-2" of video signals Vsigs is output to the plurality of source lines S1, S2, S3, . . . .

FIG. 21 illustrates the writing order of the video signals Vsigs in pixels 200. Since the writing of the video signals Vsigs in pixels 200 is executed in accordance with the arrangement order of the gate lines as shown in FIG. 20, the writing order is as shown in FIG. 21.

In the structure of the pixel wiring lines described above in which the number of the source lines is reduced by half, some adjacent columns of pixels have a source line therebetween, and other adjacent columns of pixels do not have a source line therebetween. As illustrated in the equivalent circuit of FIG. 22, at the points without source lines between pixels, there is parasitic capacitance between the pixels that is larger than at points where a source line is provided between adjacent pixels. Among pixels having inter-pixel parasitic capacitance 204, voltage leakages occur, and as a result the electrical potential at the pixel 200 written first varies under the influence of the voltage at the pixel 200 written later. The variation in voltage appears as display unevenness on the screen. Since the order of writing is fixed as depicted in FIG. 21, the display unevenness caused by the leakage always occurs at the same points.

FIG. 23 is a view illustrating an example of the display unevenness. FIG. 23 illustrates the display unevenness only of the G pixels 200 so as to make the example clearly understandable. Here, the scanning order of the gate lines is expressed as G1, G2, G3, . . . , G8. At the pixels 200 of other colors which are depicted in a ground color black in FIG. 23, the electrical potential of the pixels 200 written first varies in a similar manner (described in detail later).

FIG. 24 shows configurations of each pixel when the display panel is a TFT liquid crystal display (LCD). Each pixel 200 is configured such that a liquid crystal (not shown) is held between the common electrode to which the common voltage Vcom is to be applied (not shown) and the pixel electrode connected to a source line through a TFT 202 which is also connected with a gate line. Holding an electric charge at a liquid crystal capacitor Clc over a field period (frame period in the case of a non-interlace system) achieves the corresponding display. As a countermeasure against current leakage through the capacitor Clc and the TFT, an auxiliary capacitor Cs is disposed in parallel with the capacitor Clc.

FIG. 25A is a scanning timing chart of gate lines G1-G4 by the gate driver. FIG. 25B is a view illustrating pixel electrical potential waveforms of a pixel F in green connected, for example, to the source line S3 in FIG. 22 to be written earlier (pixel “G-first”), and of a pixel L in red connected, for example, to the source line S2 in FIG. 22 to be written later (pixel “R-later”) when horizontal line inversion driving, which reverses the polarity of a common voltage Vcom every half horizontal period (½ H), is performed.

Hereinafter, the case of a liquid crystal display device in a normally white mode that reduces a transmission factor (becomes dark) as the voltage applied to the pixel becomes larger will be described. FIG. 25B shows the case in which the amplitude of the common voltage Vcom is set to 5.0V, the voltage to write the pixel F (G-first) (video signal Vsig) is set to 2.0V against the common voltage Vcom (intermediate tone), and the voltage to write the pixel L (R-later) (video signal Vsig) is set to 4.0V against the common voltage Vcom (black, dark). Since the influence of drawing voltage (field through voltage) ΔV generated when the TFT 202 is switched from on to off can be cancelled through adjustment of the common voltage Vcom (shift Vcom downward by ΔV), the influence is not illustrated at the waveform in FIG. 25B (the same applies to figures of other pixel electrical potential waveforms described later).

As shown in FIG. 25A, if the period to write the video signals in the pixels of one row on the display screen is set as one horizontal period, two gate lines are selected sequentially in the one horizontal period. That is, if the period in which one gate line is selected is set to one scanning period, the one horizontal period is equivalent to two scanning periods (one scanning period is equivalent to the half horizontal period mentioned above). The two gate lines to be selected in the one horizontal period are switched sequentially for every horizontal period in each field. At this moment, as shown in FIG. 25B, the TFTs 202 connected to the selected gate line are turned on, and the video signals Vsigs applied from the source lines are written to the corresponding pixels 200. Accordingly, the write timing of the pixel F (G-first) becomes $W_G$, and the write timing of pixel L (R-later) becomes $W_R$ in FIG. 25B. The pixel electrical potential written at the write timing is maintained until that pixel is re-written in the next field.

FIG. 25B illustrates pixel electrical potential waveforms in an ideal state when the inter-pixel parasitic capacitance 204 is “0”. However, as mentioned above, the inconvenience of the occurrence of the capacitance 204 is generated at the point between pixels with no source line. FIG. 26A is a view illustrating the pixel electrical potential waveforms under the same voltage conditions as those of FIG. 25B with the capacitance 204 taken into consideration. FIG. 26B is a view illustrating the pixel electrical potential waveform in the case in which the amplitude of the common voltage Vcom is set to 5.0V, the write voltage of the pixel F (G-first) is set to 2.0V against the common voltage Vcom, and the write voltage of the pixel L (R-later) is set to 1.0V (white, bright), when the capacitance 204 is taken into account.

As shown in FIG. 26A and FIG. 26B, at the pixel F (G-first), the pixel electrical potential written by selecting the gate line G1 shifts to the direction going away from the common voltage Vcom (direction getting dark) by an electrical potential variation Vc in writing the pixel L (R-later) by selecting the gate line G2. The height of the variation Vc is expressed by the following equation (Eq.) (1):

$$Vc=(V\mathrm{sig}(F_{n-1})+V\mathrm{sig}(F_n))\times Cpp/(Cs+Clc+Cpp)\times\alpha \quad (1)$$

In Eq. (1), “Vsig($F_n$)” is the write voltage of the pixel L (R-later) in a current field, and “Vsig($F_{n-1}$)” is the write voltage of the pixel L (R-later) in the preceding field. Therefore, in the case of FIG. 26A, “Vsig($F_{n-1}$)+Vsig($F_n$)=8.0V” is satisfied, and in the case of FIG. 26B, “Vsig($F_{n-1}$)+Vsig($F_n$)=2.0V” is satisfied. Cpp is a capacitance value of the parasitic capacitance 204, Cs is a capacitance value of the auxiliary capacitance Cs, Clc is a capacitance value of the liquid crystal capacitance Clc, and a is a proportional factor whose value is determined in accordance with a panel structure, etc.

As described above, the larger the value of “Vsig($F_{n-1}$)+Vsig($F_n$)” is, the larger the value Vc of electrical potential variation becomes, and it does not depend on the magnitude of the amplitude of the common voltage Vcom.

The description above has described the case of the horizontal line inversion driving which differs in polarity of the common voltage Vcom (polarity of a voltage to be applied to a liquid crystal) among pixels adjacent to one another in the direction along the source line. That is, the description is the case in which, for instance, in FIG. 21, the polarity of the common voltage Vcom is inverted for the pixels connected to the gate line G3 or G4 with respect to the pixels connected to the gate line G1 or G2, and is similarly inverted for the pixels connected to the gate line G5 or G6 with respect to the pixels connected to the gate line G3 or G4, and is inverted for the pixels connected to the gate line G7 or G8 with respect to the pixels connected to the gate line G5 or G6.

To perform the polarity inversion of the common electrode Vcom, a driving method referred to as dot inversion driving is known. In this driving method, the polarity of the common voltage Vcom differs between pixels adjacent to each other in the direction along the source line and between pixels adjacent to each other in the direction along the gate line. In this driving method, so that the polarities of the common voltages Vcoms among pixels adjacent to each other from right to left or up-and-down invert with respect to each other, the polarity of the common voltage Vcom is inverted between the gate line G1 and the gate line G2, between the gate line G3 and the gate line G4, between the gate line G5 and the gate line G6, and between the gate line G7 and the gate line G8.

In any case of the horizontal line inversion driving and the dot inversion driving, the polarities of the common voltages Vcoms at the respective pixels are inverted in each field.

FIGS. 27A and 27B show the cases of performing such dot inversion driving. Here, FIG. 27A illustrates the pixel electrical potential waveforms in the case in which the amplitude of the common voltage Vcom is set to 5.0V, the write voltage of the pixel F (G-first) is set to 2.0V (intermediate tone) against the common voltage Vcom, and the write voltage of the pixel L (R-later) is set to 4.0V (black) against the common voltage Vcom, taking the inter-pixel parasitic capacitance 204 into account. FIG. 27B illustrates the pixel electrical potential waveforms in the case in which the amplitude of the common voltage Vcom is set to 5.0V, the write voltage of the pixel F (G-first) is set to 2.0V against the common voltage Vcom, and the write voltage of the pixel L (R-later) is set to 1.0V (white) against the common voltage Vcom, taking the inter-pixel parasitic capacitance 204 into account.

As shown in FIGS. 27A and 27B, also when performing the dot inversion driving, in the same way as when performing the horizontal line inversion driving, at the pixel F of G-first, in writing the pixel L of R-later by selecting the gate line G2, the pixel electrical potential written by selecting the gate line G1, shifts by the variation Vc.

Also in such a case, the larger the value of “Vsig($F_{n-1}$)+Vsig($F_n$)” is, the larger the value Vc of the electrical potential variation becomes, and the variation Vc does not depend on the amplitude of the common voltage Vcom as in the case of the horizontal line inversion driving.

In the horizontal line inversion driving, the potential variation occurs in such a manner as to increase the potential difference between the common voltage Vcom and the write voltage. In the dot inversion driving, in contrast, the potential variation occurs in such a manner as to decrease the potential difference between the common voltage Vcom and the write voltage.

In the normally white mode, wherein "white" is displayed when no voltage is applied and "black" is displayed when voltage is applied, the variations of Vc as described above result in making the pixel G-first darker than intended in the case of the horizontal line inversion driving. In the case of the dot inversion driving, the variations described above result in making the pixel G-first brighter than intended. On the other hand, G pixels written later ("G-later") have a normal voltage for the pixel electrical potential. As a result, a display like a G raster results in displays of alternate bright and dark lines in a longitudinal direction also in both horizontal line inversion driving and dot inversion driving.

Similar variations of the variation Vc also occur at the pixel R-first and at the pixel B-first.

The situation described above is not limited in the case of a strip arrangement of the pixels 200, and also applies to the case of a delta arrangement.

The method disclosed by the foregoing Jpn. Pat. Appln. KOKAI Publication No. 2004-185006 cannot deal with the problem of display unevenness due to the electrical potential variations generated at the previously written pixels caused by such inter-pixel parasitic capacitance 204.

SUMMARY OF THE INVENTION

The present invention is made in view of such conventional problems, and an object thereof is to provide a driving circuit and a driving method of an active matrix display device, and an active matrix display device, to produce display unevenness caused by inter-pixel parasitic capacitance that is hardly visible.

According to one aspect of the invention, a driving circuit is provided for an active matrix display device, wherein the active matrix display device includes a plurality of scanning lines, a plurality of signal lines, and a plurality of pixels, wherein one signal line is provided for every two pixels arranged along a scanning line direction of the active matrix display, and each two pixels which are adjacent to each other along the scanning line direction across one of the signal lines share the signal line and are each connected to different scanning lines through switching elements.

The driving circuit includes a signal line driving circuit which outputs signals, based on information to be displayed, to the plurality of signal lines; and a scanning line driving circuit which performs: (i) a first driving control which sequentially selects, in a first order, the scanning lines in a pair of two scanning lines corresponding to two pixels which are adjacent to each other along the scanning line direction and are connected to different signal lines, and (ii) a second driving control which sequentially selects, in a second order which is opposite to the first order, the scanning lines in a pair of two scanning lines corresponding to two pixels which are adjacent to each other along the scanning line direction and are connected to different signal lines.

According to another aspect of the present invention, a driving method is provided for an active matrix display device, wherein the active matrix display device includes a plurality of scanning lines, a plurality of signal lines, and a plurality of pixels, wherein one signal line is provided for every two pixels arranged along a scanning line direction of the active matrix display, and each two pixels which are adjacent to each other along the scanning line direction across one of the signal lines share the signal line and are each connected to different scanning lines through switching elements.

The method includes: performing a first driving control of sequentially selecting, in a first order, the scanning lines in a pair of two scanning lines corresponding to two pixels which are adjacent to each other along the scanning line direction and are connected to different signal lines; and performing a second driving control of sequentially selecting, in a second order which is opposite to the first order, the scanning lines in a pair of two scanning lines corresponding to two pixels which are adjacent to each other along the scanning line direction and are connected to different signal lines.

According to a further aspect of the present invention, an active matrix display device is provided which includes a display panel, which includes a plurality of scanning lines, a plurality of signal lines, and a plurality of pixels, wherein one signal line is provided for every two pixels arranged along a scanning line direction of the active matrix display, and each two pixels which are adjacent to each other along the scanning line direction across one of the signal lines share the signal line and are each connected to different scanning lines through switching elements.

The active matrix display device also includes a signal line driving circuit which outputs signals, based on information to be displayed, to the plurality of signal lines. And the active matrix display device includes a scanning line driving circuit which performs: (i) a first driving control which sequentially selects, in a first order, the scanning lines in a pair of two scanning lines corresponding to two pixels which are adjacent to each other along the scanning line direction and are connected to different signal lines, and (ii) a second driving control which sequentially selects, in a second order which is opposite to the first order, the scanning lines in a pair of two scanning lines corresponding to two pixels which are adjacent to each other along the scanning line direction and are connected to different signal lines.

According to the invention, even if the inter-pixel parasitic capacitance exists, display unevenness can be made hardly visible.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE DRAWINGS

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION

In the following, a period to write video signals in all of the pixels of the display is one field, a period to write video signals in all of the pixels of one row is one horizontal period, and a period to write video signals in all of the pixels connected to one gate line is one scanning period.

First Embodiment

Figure 1A:
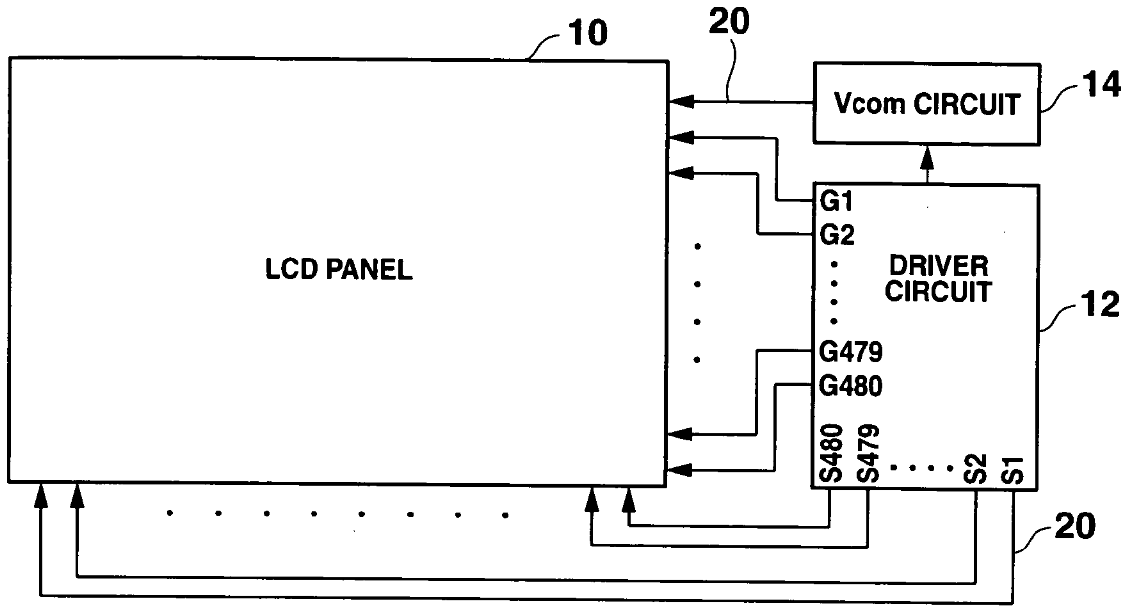
FIG. 1A is a schematic configuration view depicting a whole configuration of an active matrix display device according to the first embodiment of the invention.
Figure 1B:
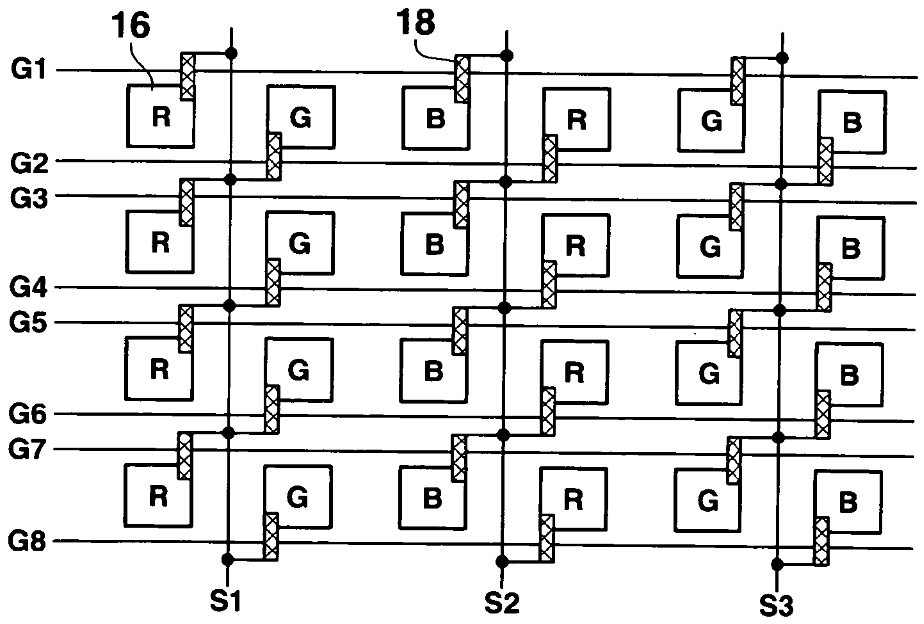
FIG. 1B is a schematic view of pixel wiring lines on an LCD panel (a display panel) in FIG. 1A.

FIG. 1A is a schematic configuration view illustrating a whole configuration of an active matrix display device regarding the first embodiment of the invention, and FIG. 1B is a schematic view of pixel wiring lines of an LCD panel (liquid crystal display panel) in FIG. 1A.

That is, as shown in FIG. 1A, the active matrix display device according the first embodiment includes an LCD panel (display panel) 10 with a plurality of pixels arranged thereon; a driver circuit 12 which drives and controls each pixel of the LCD panel 10; and a Vcom circuit 14 which applies a common voltage Vcom to the LCD panel 10.

On the LCD panel 10, as shown in FIG. 1B, a plurality of pixels 16 are arranged in a matrix form. A plurality of source lines (signal lines) S1-S480 and a plurality of gate lines (scanning lines) G1-G480 are arranged to cross each other. The respective pixels 16 are each connected to one source line and one gate line through the respective TFTs 18, which are switching elements, of the pixels. The pixels 16 are disposed so that each pair of two adjacent pixels 16 share one source line, and such that the respective TFTs 18 corresponding to the two adjacent pixels 16 sharing a source line are connected to different gate lines. For instance, in FIG. 1B, a TFT 18 of a pixel 16 (R) at the upper left is connected to a gate line G1 and a source line S1, and a TFT 18 of the next pixel 16 (G) on the right is connected to a gate line G2 and the source line S1. In the arrangement shown in FIG. 1B, the pixels 16 are disposed in a stripe arrangement, and each pixel in an odd-numbered column is connected to an odd-numbered gate line, while each pixel in an even-numbered column is connected to an even-numbered gate line.

Wirings 20 which are wired on a substrate (not shown) of the LCD panel 10 electrically connect the plurality of source lines S1-S480 and the plurality of gate lines G1-G480 of the LCD panel 10 to the driver circuit 12.

Figure 2:
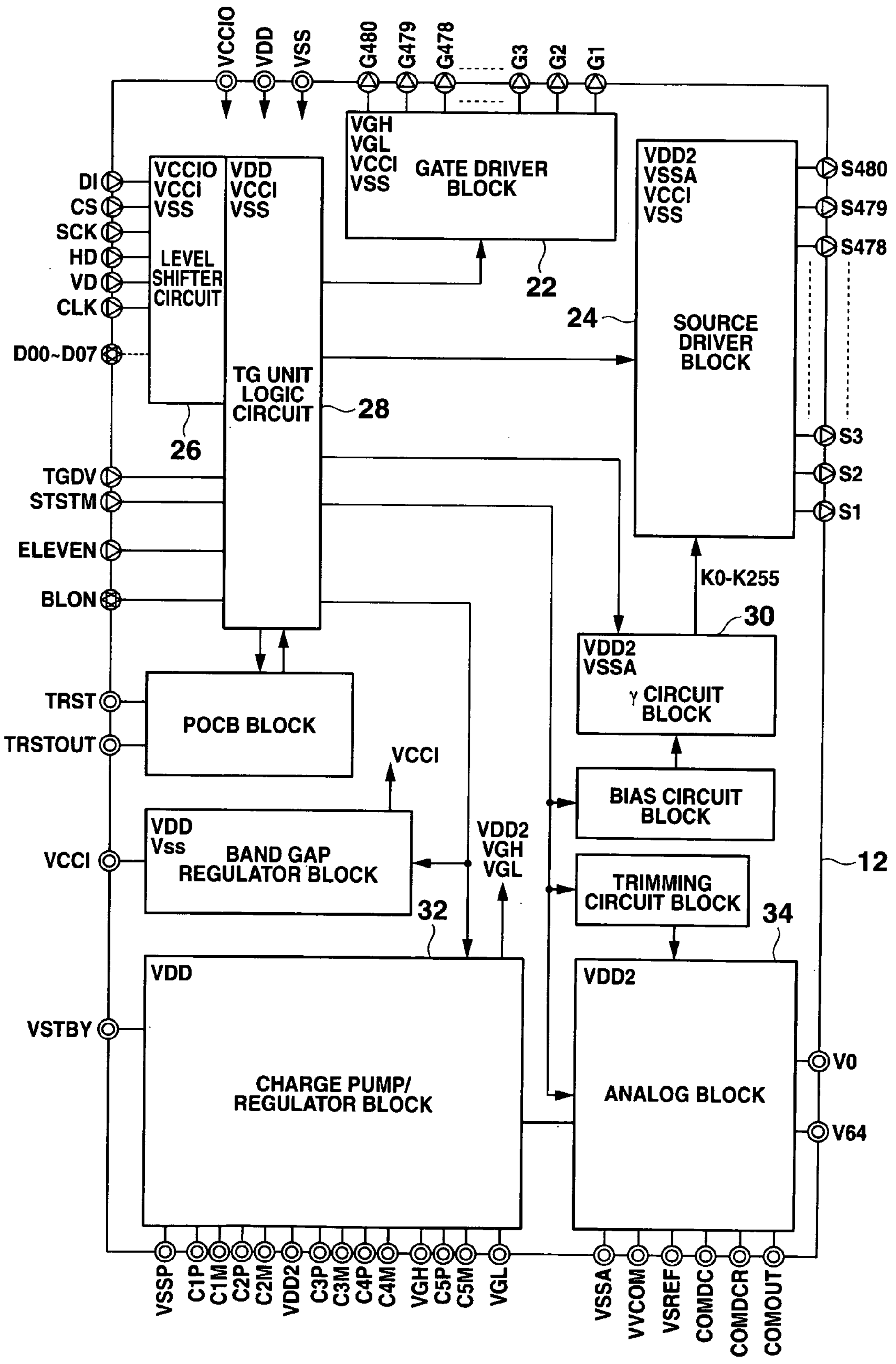
FIG. 2 is a block diagram of a driver circuit in FIG. 1A.

FIG. 2 is a block configuration view of the driver circuit 12 in FIG. 1A. The driver circuit 12 includes a gate driver block (scanning line driving circuit) 22; a source driver block (signal line driving circuit) 24; a level shifter circuit 26; a timing generator (TG) unit logic circuit 28, a gamma (γ) circuit block 30, a charge pump/regulator block 32, an analog block 34 and other blocks, as shown in FIG. 2.

Here, the gate driver block 22 selects the plurality of gate lines G1-G480 of the LCD panel 10, and the source driver block 24 outputs video signals Vsigs to the plurality of source lines S1-S480 of the LCD panel 10 based on information to be displayed.

The level shifter circuit 26 shifts levels of signals to be supplied from outside to prescribed levels. The TG unit logic circuit 28 generates necessary timing signals and control signals on the basis of the signals shifted to the prescribed levels by the shifter circuit 26 and the signals supplied from outside to supply the timing signals and control signals to each unit within the driver circuit 12.

The γ circuit block 30 applies γ correction so that the video signals Vsigs output from the source driver block 24 have excellent gradation characteristics.

The charge pump/regulator block 32 generates a variety of voltages of necessary logical levels from an external power source, and the analog block 34 generates further various voltages from the voltages generated from the regulator block 32. The Vcom circuit 14 generates the common voltage Vcom from a voltage VVCOM generated from the analog block 34. The explanation of other blocks will be omitted because they have no direct relationship to the present invention.

Figure 3:
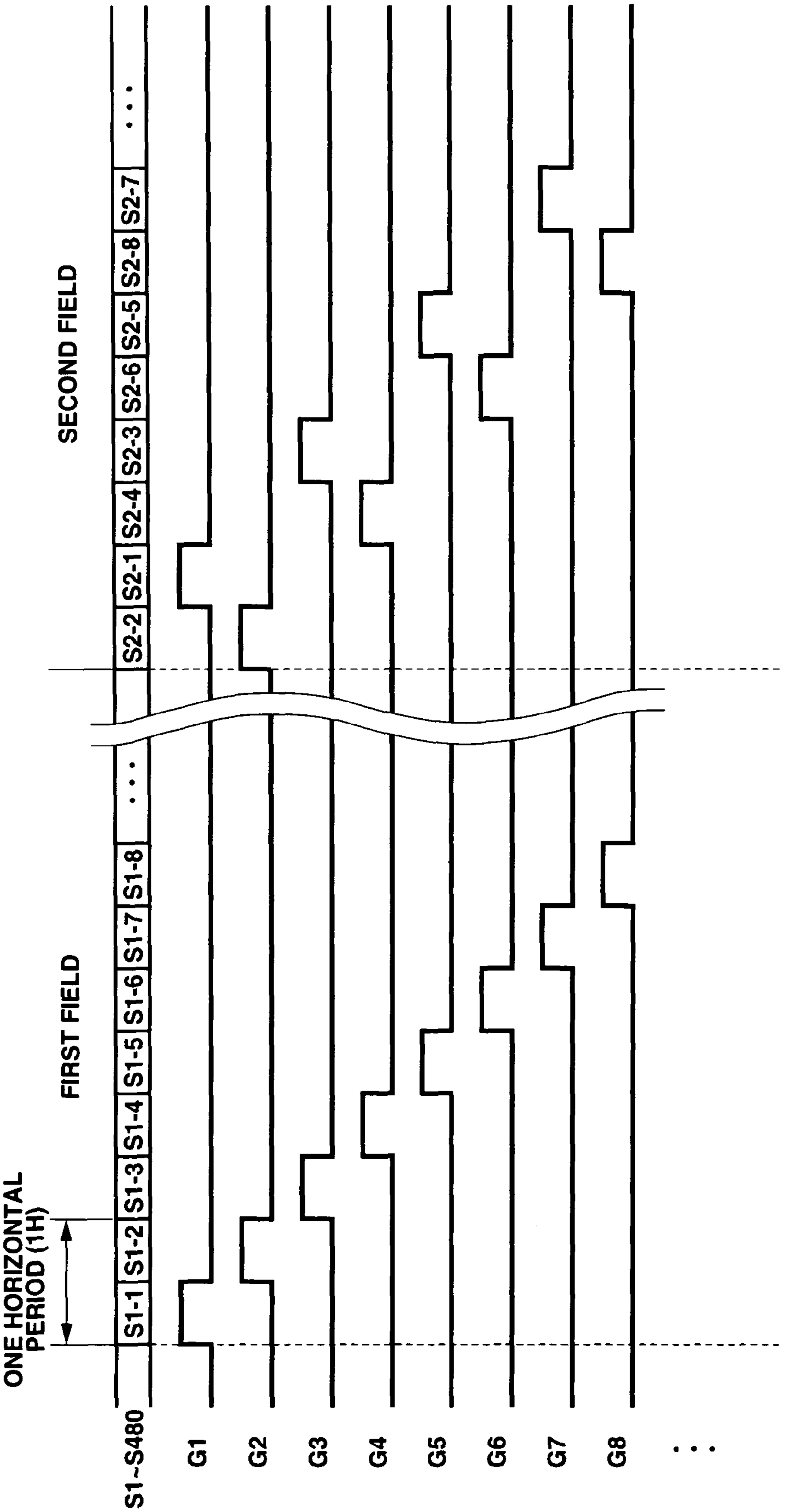
FIG. 3 is a timing chart of the output order of combinations of video signals based on information to be output to a plurality of source lines to be displayed, and the selection order of a plurality of gate lines in the first embodiment.
Figure 4A:
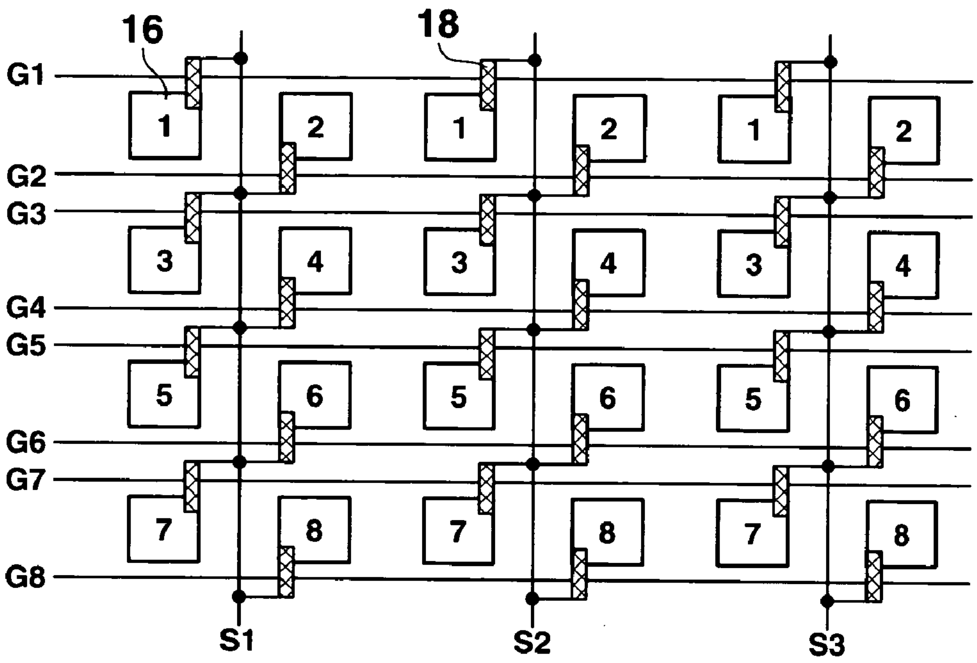
FIG. 4A is a view depicting the writing order of video signals in pixels in a first field of the first embodiment.
Figure 4B:
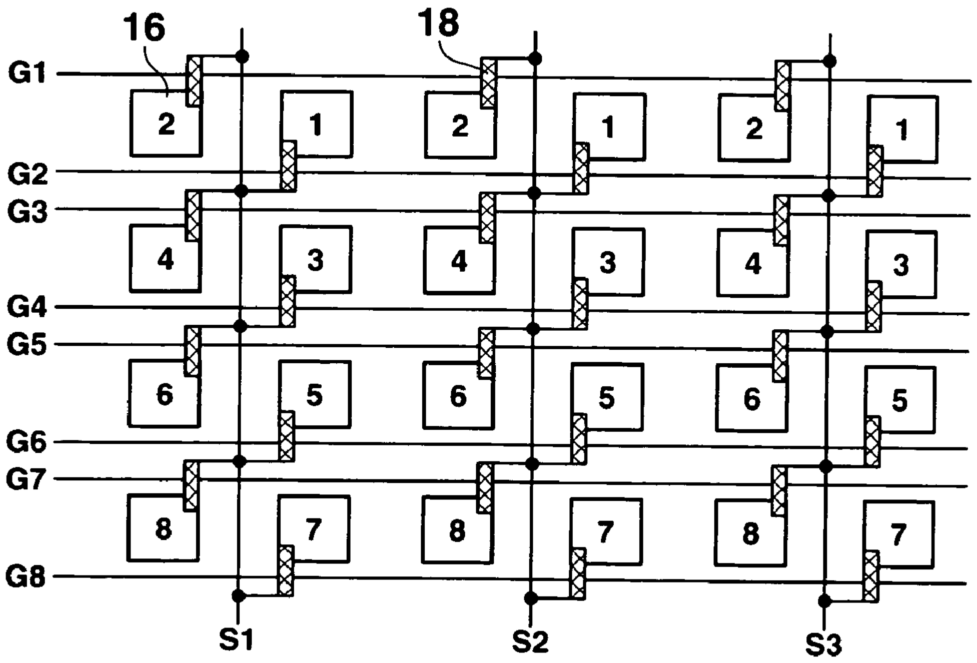
FIG. 4B is a view depicting the writing order of video signals in pixels in a second field of the first embodiment.

FIG. 3 shows a timing chart consisting of the output order of combinations of video signals Vsigs (as used herein, one "combination of video signals Vsigs" refers to all of the video signals Vsigs outputted in one scanning period) based on the information to be output to the plurality of source lines S1-S480 to be displayed, and of selection order of the plurality of gate lines G1-G480 (for simplification, only gate lines G1-G8 are shown in FIG. 3; it should be understood, however, that as explained above, all of the gate lines G1-G480 are selected during one field). FIGS. 4A and FIG. 4B each illustrates writing orders of the video signals Vsigs in pixels 16. Here, for convenience, FIG. 4A depicts the first field (that is, each odd-numbered field) and FIG. 4B depicts the second field (that is, each even-numbered field). (The first and second fields may switch positions with one another.)

In the first embodiment, as shown in FIG. 3, the driver circuit 12 changes the selection order of the plurality of gate lines G1-G480 in each field.

That is, in the first field, like the conventional display device, the gate driver block 22 of the driver circuit 12 in the first embodiment performs a first drive control in which the gate driver block 22 sequentially selects (produces H signals) the plurality of gate lines G1-G480 in accordance with the arrangement order of the plurality of gate lines such that one gate line is selected in each half horizontal period (½ H). The source driver block 24 outputs at one time the combination of the video signals Vsigs to write in each pixel 16 corresponding to the selected gate line to the plurality of source lines S1-S480 during the half horizontal period. For instance, during a half horizontal period in which a gate line G1 is selected, a combination of the video signals Vsigs that is designated by "S1-1" is output to the plurality of source lines S1-S480, and during the next half horizontal period in which a gate line G2 is selected, a combination of the video signals Vsigs that is designated by "S1-2" is output to the plurality of source lines S1-S480.

In other words, for each pair of gate lines corresponding to one row of pixels (i.e., gate lines G1 and G2, G3 and G4, etc.), in accordance with the selection order of the gate lines whereby the odd-numbered gate line is selected and then the even-numbered gate line is selected (the gate lines are sequentially selected in order from the upper side of the display panel), the source driver block 24 first outputs the data corresponding to the pixels in the odd-numbered columns and then outputs the data corresponding to the pixels in the even-numbered columns.

Therefore, in the first field, since the writing of the video signals Vsigs in the pixels is implemented in accordance with the arrangement order of the gate lines as shown in FIG. 3, the writing results in the writing order shown in FIG. 4A. Thereby, voltage leakages occur among pixels due to the inter-pixel parasitic capacitance 204 at locations where a source line is not provided between adjacent pixels, and the electrical potentials of the pixels 16 which have been written earlier vary under the influence of the electrical potentials of the pixels 16 which have been written later.

In the second field, as shown in FIG. 3, the gate driver block 22 performs a second drive control in which the gate driver block 22 reverses, with respect to the selection order in the first field, the selection order of the gate lines within each pair of gate lines corresponding to one row of pixels. For example, with respect to the two gate lines G1 and G2, the gate driver block 22 selects the gate line G2 and then the gate line G1, and with respect to the two gate lines G3 and G4, the gate driver block 22 selects the gate line G4 and then the gate line G3.

The source driver block 24 outputs the combination of the video signal Vsigs to be written in the pixels 16 corresponding to the selected gate line to the plurality of source lines S1-S480 in the half horizontal period in which the gate line is selected. Thus, the source driver block 24 outputs the combinations of the video signals Vsigs to the gate lines in accordance with the changed selection order in the second field. That is, the source driver block 24 outputs the data corresponding to the pixels in the even-numbered columns and then outputs the data corresponding to the pixels in the odd-numbered columns during one horizontal period in response to the selection order of the gate lines in each pair of gate lines corresponding to one row of pixels (wherein after the even-numbered gate line of the pair, the odd-numbered gate line of the pair is selected).

Thereby, for example, in the first field, the source driver block 24 outputs the combinations of the video signals Vsigs "S1-1", "S1-22", "S1-3", "S1-4", "S1-5", "S1-6", . . . , in that order. However, in the second field, the source diver block 24 changes the output order and outputs the combinations of the video signals Vsigs "S2-2", "S2-1", "S2-4", "S2-3", "S2-6", "S2-5", . . . , in that order.

Accordingly, in the second field, since the writing of the video signals Vsigs in the pixels 16 via the pixel wiring lines (the number of which has been reduced half) is performed in accordance with the order in which the gate lines are selected, which is reversed for each pair of gate lines corresponding to one row of pixels with respect to the order in which the gate lines in each pair are selected in the first field, (that is, in the second field, data is written in the pixels in the even columns first and then in the pixels in the odd columns for each row of pixels), as shown in FIG. 3, the writing order is as shown in FIG. 4B. Thereby, also in the second field, voltage leakages occur among pixels due to the inter-pixel parasitic capacitance 204 at locations where a source line is not provided between adjacent pixels, and the electrical potentials of the pixels 16 which have been written earlier are varied under the influence of the electrical potentials of the pixels 16 which have been written later.

However, the pixels 16 whose electrical potentials are varied in the second field are different from the pixels 16 whose electrical potentials are varied in the first field. In other words, in the second field, since the writing order of the video signals Vsigs is made to be contrary to the writing order of the video signals Vsigs of the first field, the writing order of the video signals Vsigs in the pixels 16 which are adjacent to each other without a source line therebetween is changed between the first and second fields. Therefore, the positions of pixels at which the electrical potential differences occur are reversed between the first and second fields, and as a result, deviance of pixel potentials are averaged temporally, and display unevenness is reduced.

Figure 5:
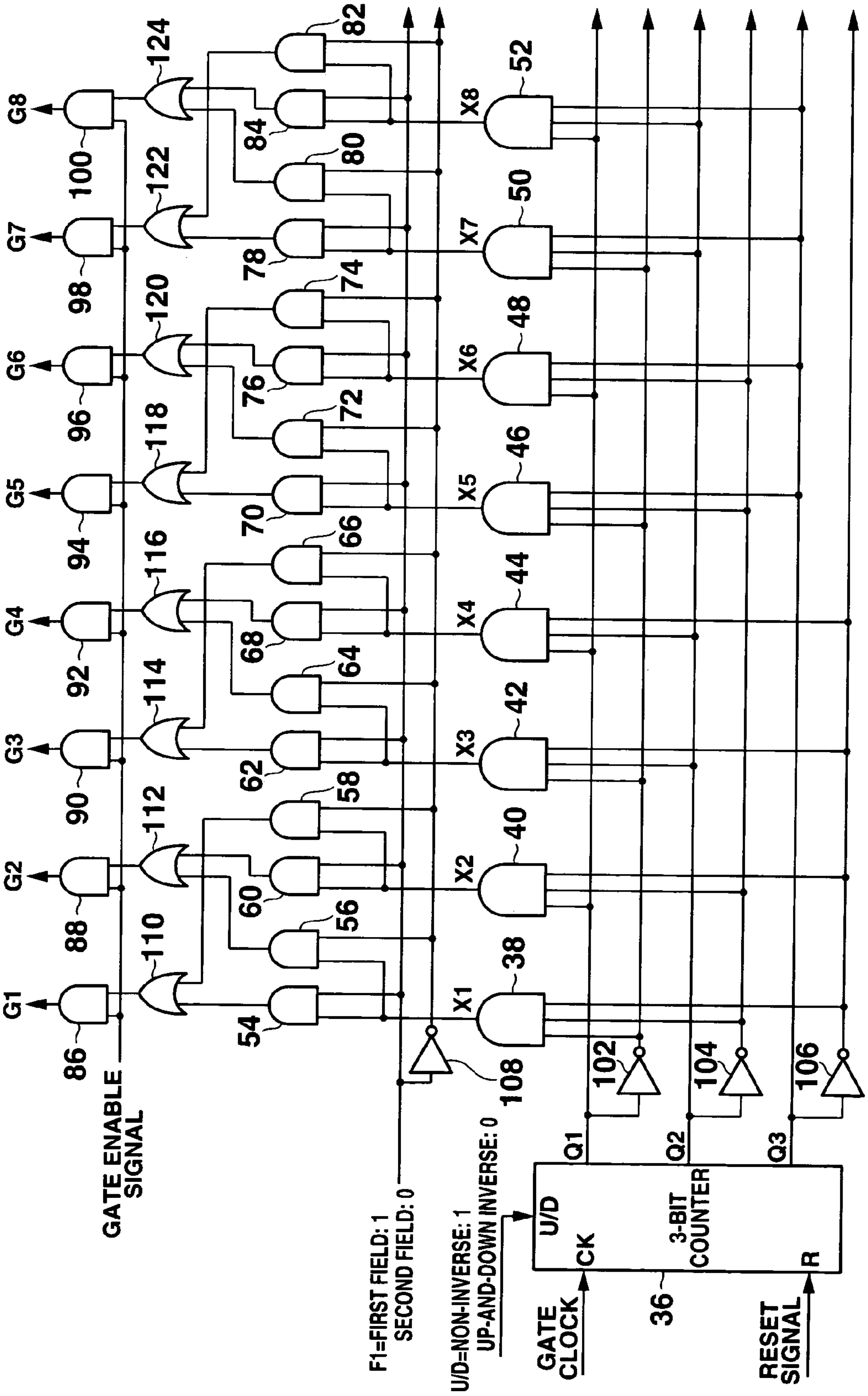
FIG. 5 is a view depicting a concrete configuration of a gate driver block of FIG. 2 in the first embodiment.

FIG. 5 shows a concrete configuration of the gate driver block 22 to perform the drive control described above. For the purpose of simplifying the description and illustration of the gate driver block, here, the number of the gate lines will be set to eight. In this case, the gate driver block 22 comprises a three-bit counter 36; 32 AND gates 38-100; four NOT gates 102-108; and eight OR gates 110-124.

A gate clock and an up-and-down (U/D) signal are supplied to the three-bit counter 36 from the TG logic circuit 28. The U/D signal is '1' in a non-inverse shift that produces a normal display, and is '0' in an up-down-inverse shift that produces an upside down display. This is because in the up-and-down inverse shift the scanning direction of the gate lines is upside down with respect to the scanning direction in the non-inverse shift, and as a result, the pixel to be written earlier and the pixel to be written later are reversed with respect to each other and the operations of the gate driver block 22 have to be switched accordingly.

After the timing of release of a reset signal for reset a count value of the three-bit counter 36, the three-bit counter 36 starts counting in response to the gate clock and the U/D signal.

A Q1 output from the three-bit counter 36 is supplied to the AND gates 40, 44, 48 and 52 for even-numbered lines X2, X4, X6 and X8 to be decoded, respectively, and is also supplied through the NOT gate 102 to the AND gates 38, 42, 46 and 50 for odd-numbered lines X1, X3, X5 and X7 to be decoded, respectively. A Q2 output from the three-bit counter 36 is supplied to the AND gates 42, 44, 50 and 52 for the lines X3, X4, X7 and X8, respectively, and is also supplied through the NOT gate 104 to the AND gates 38, 40, 46, and 48 for the lines X1, X2, X5 and X6, respectively. A Q3 output from the three-bit counter 36 is supplied to the AND gates 46, 48, 50 and 52 for the lines X5, X6, X7 and X8, respectively, and is also supplied through the NOT gate 106 to the AND gates 38, 40, 42 and 44 for the lines X1, X2, X3 and X4, respectively.

The output from the AND gate 38 for the line X1 is supplied to the first AND gates 54, 56 for the gate lines G1, G2, respectively. A field switching (FI) signal is supplied to the first AND gate 54 for the gate line G1 from the TG unit logic circuit 28, and the FI signal is supplied to the first AND gate 56 for the gate line G2 via the NOT gate 108. As is explained in more detail below, the FI signal is set at 1 (referred to as H, meaning high level) for the first field, and the FI signal is set at 0 (referred to as L, meaning low level) for the second field.

The output from the AND gate 40 for the line X2 is supplied to the second AND gates 58 and 60 for the gate lines G1 and G2, respectively. In contrast to the first AND gates 54 and 56 for the gate lines G1 and G2, the FI signal is supplied to the second AND gate 58 for gate line G1 through the NOT gate 108, and the FI signal is supplied to the second AND gate 60 for the gate line G2.

The outputs from the first AND gate 54 for the gate line G1 and from the second AND gate 58 for the gate line G1 are supplied to the OR gate 110 for the gate line G1. The output from the OR gate 110 for the gate line G1 is supplied to the gate line G1 through a third AND gate 86 for the gate line G1 to be controlled by a gate enable signal, which allows gate outputs at predetermined times, from the TG unit logic circuit 28. The outputs from the first AND gate 56 for the gate line G2 and from the second AND gate 60 for the gate line G2 are supplied to the OR gate 112 for the gate line G2, and the output from the OR gate 112 for the gate line G2 is supplied to the gate line G2 through a third AND gate 88 for the gate line G2 to be controlled by the gate enable signal.

Similarly, the output from the AND gate 42 for the line X3 is supplied to first AND gates 62 and 64 for the gate lines G3 and G4, the output from the AND gate 46 for the line X5 is supplied to first AND gates 70 and 72 for the gate lines G5 and G6, and the output from the AND gate 50 for the line X7 is first AND gates 78 and 80 for the gate lines G7 and G8. The FI signal is supplied to first AND gates 62, 70 and 78 for the gate lines G3, G5 and G7, respectively, and the FI signal is supplied through the NOT gate 108 to first AND gates 64, 72 and 80 for the gate lines G4, G6 and G8 are supplied, respectively. The output from the AND gate 44 for the line X4 is supplied to the second AND gates 66 and 68 for the gate lines G3 and G4, the output from the AND gate 48 for the line X6 is supplied to the second AND gates 74 and 76 for the gate lines G5 and G6, and the output from the AND gate 52 for the line X8 is supplied to the second AND gates 82 and 84 for the gate lines G7 and G8. The FI signal is supplied through the NOT gate 108 to the second AND gates 66, 74 and 82 for the gate lines G3, G5 and G7, respectively, and the FI signal is supplied to the second AND gates 68, 76 and 84 for the gate lines G4, G6 and G8, respectively. The outputs from the first AND gates 62, 70 and 78 for the gate lines G3, G5 and G7, and the outputs from the second AND gates 66, 74 and 82 for the gate lines G3, G5 and G7 are supplied to OR gates 114, 118 and 122 for the gate lines G3, G5 and G7. The outputs from the OR gates 114, 118 and 122 for the gate lines G3, G5 and G7 are supplied to the gate lines G3, G5 and G7 through third AND gates 90, 94 and 98 for the gate lines C3, G5 and G7 to be controlled by the gate enable signal, respectively. The outputs from first AND gates 64, 72 and 80 for the gate lines G4, G6 and G8, and the outputs from the second AND gates 68, 76 and 84 for the gate lines G4, G6 and G8 are supplied to OR gates 116, 120 and 124 for the gate lines G4, G6 and G8, respectively. The outputs from the OR gate lines 116, 120 and 124 for the gate lines G4, G6 and G8 are supplied to the gate lines G3, G5 and G7 through third AND gates 92, 96 and 100 for the gate lines G4, G6 and G8 to be controlled by the gate enable signals, respectively.

Figure 6A:
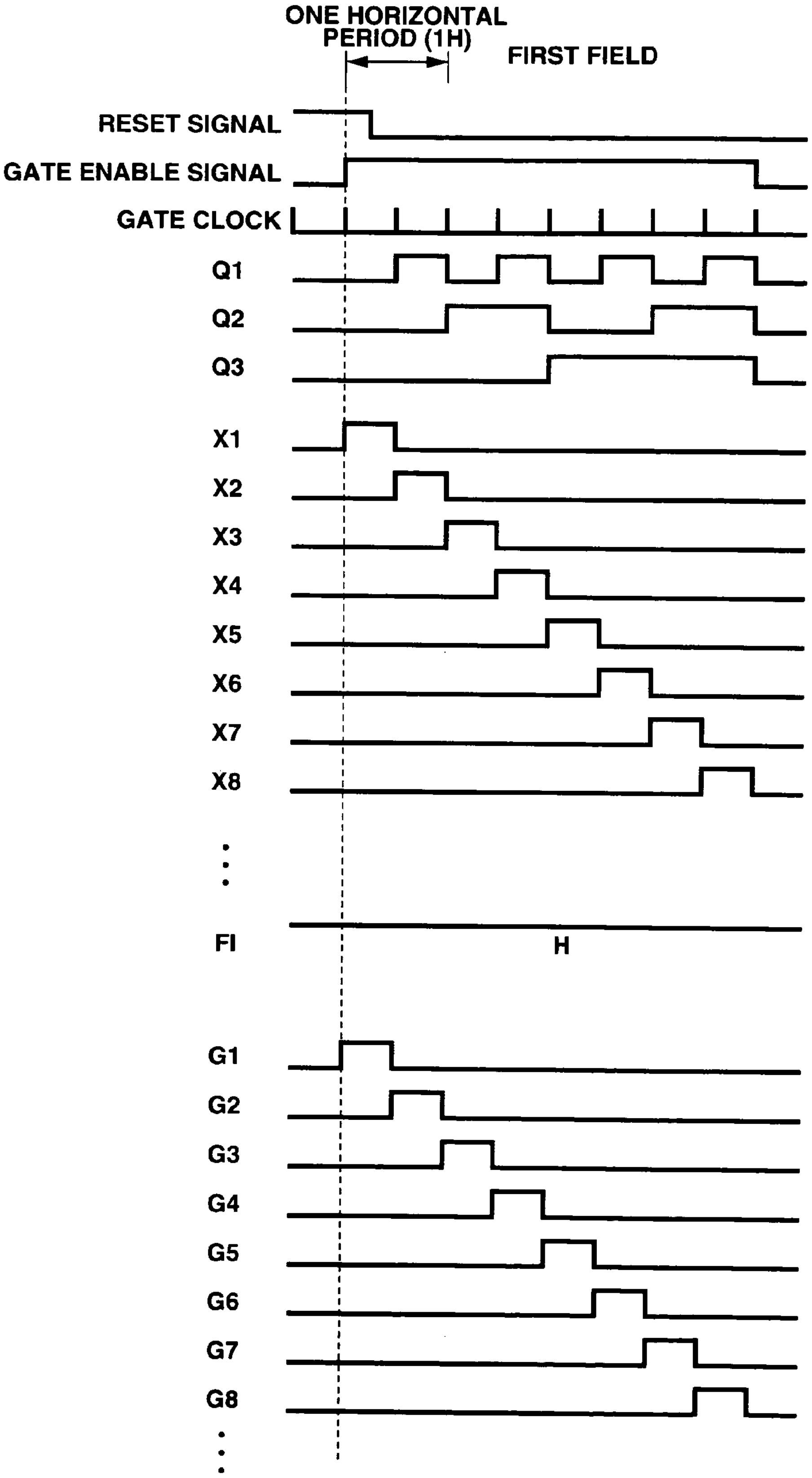
FIG. 6A is a timing chart of the first field in non-inverse shifting in the gate driver block of FIG. 5.

FIG. 6A shows a timing chart of the first field in the non-inverse shift of the gate driver block 22 configured as described above, and FIG. 6B similarly shows a timing chart of the second field.

In non-inverse shifting, in the first field, as shown in FIG. 6A, H signals are output in turn to the lines X1-X8, respectively, for a period equivalent to one pulse of a gate clock. That is, in the gate driver block 22, the line X1 is set in a selection state (H signal), the line X2 is set in the selection state, the line X3 is set in the selection state, the line X4 is set in the selection state, the line X5 is set in the selection state, the line X6 is set in the selection state, the line X7 is set in the selection state, and the line X8 is set in the selection state, in that temporal order.

Here, in the first field, the H signal is supplied as the FI signal (the FI signal is at the H level). Therefore, in the period in which the line X1 is in the selection state, only the first AND gate 54 for the gate line G1 is selected, and the gate line G1 is brought into the selection state through the OR gate 110 for gate line G1 and the third AND gate 86 for the gate line G1 to be controlled by the gate enable signal. In the period in which the line X2 is in the selection state, only the second AND gate 60 for the gate line G2 is brought into the selection state, and the gate line G2 is brought into the selection state through the OR gate 112 for the gate line G2 and the third AND gate 88 for the gate line G2 to be controlled by the gate enable signal. In a similar manner, the gate lines G3 to G8 enter the selection state sequentially after the second gate line G2.

Figure 6B:
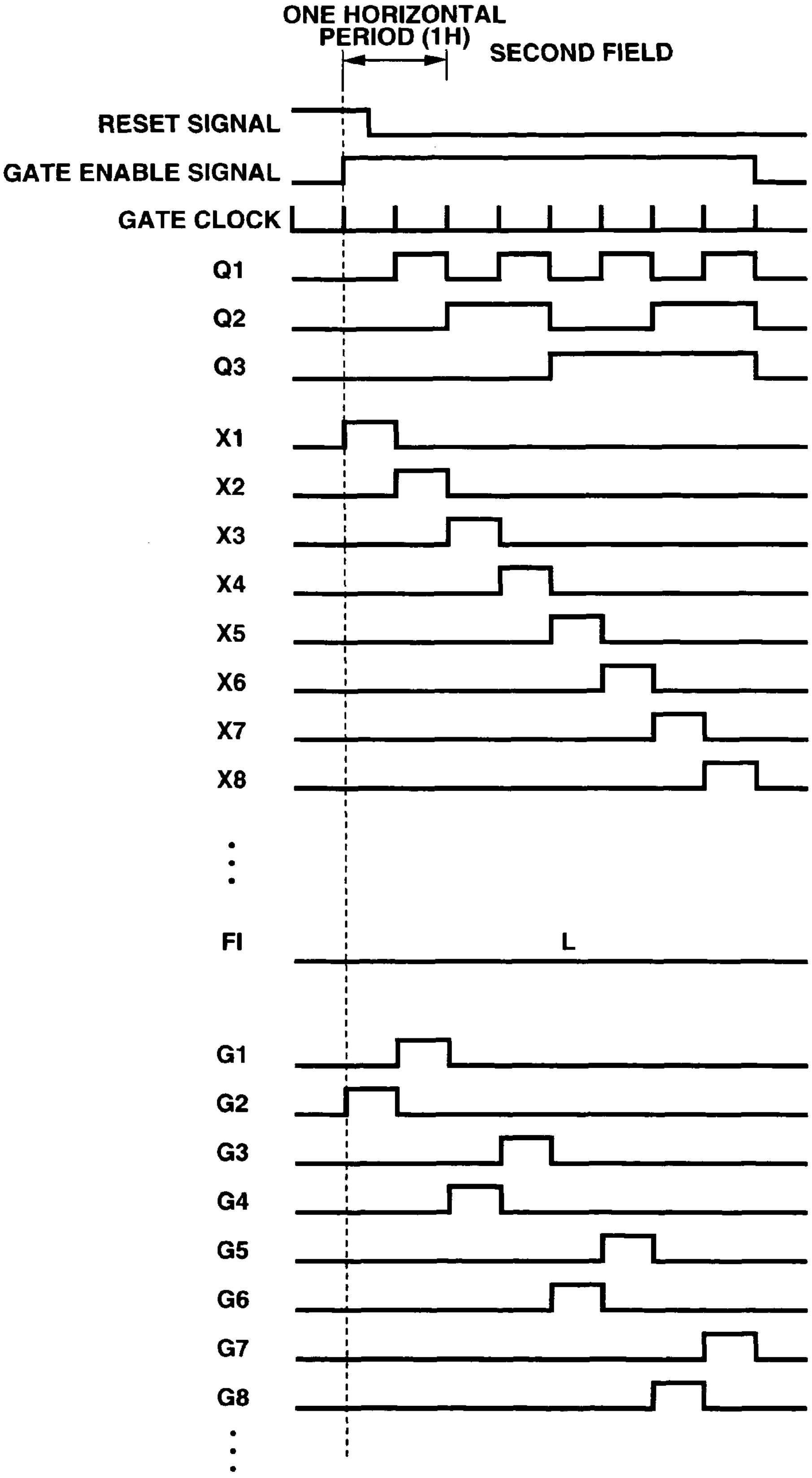
FIG. 6B a timing chart of the second field in non-inverse shifting in the gate driver block of FIG. 5.

When the gate driver block 22 enters the second field, with respect to the lines X1 to X8, the line X1, the line X2, the line X3, the line X4, the line X5, the line X6, the line X7 and the line X8, are set in selection state in that order, in a similar manner to the first field, as depicted in FIG. 6B.

Here, in the second field, an L signal is supplied as the FI signal. Therefore, in a period in which the line X1 is in the selection state, only the first AND gate 56 for the gate line G2 enters the selection state, and the gate line G2 is brought into the selection state via the OR gate 112 for the gate line G2 and the third AND gate 88 for the gate line G2 to be controlled by the gate enable signal. In a period in which the line X2 is in the selection state, only the second AND gate 58 for the gate line G1 is brought into the selection state, and the gate line G1 is brought into the selection state via the OR gate 110 for the gate line G1 and the third AND gate 86 for the gate line G1 to be controlled by the gate enable signal. Similarly the gate driver block 22 sets the gate line G4, the gate line G3, the gate line G6, the gate line G5, the gate line G8, and the gate line G7, in the selection state in that order.

Figure 7A:
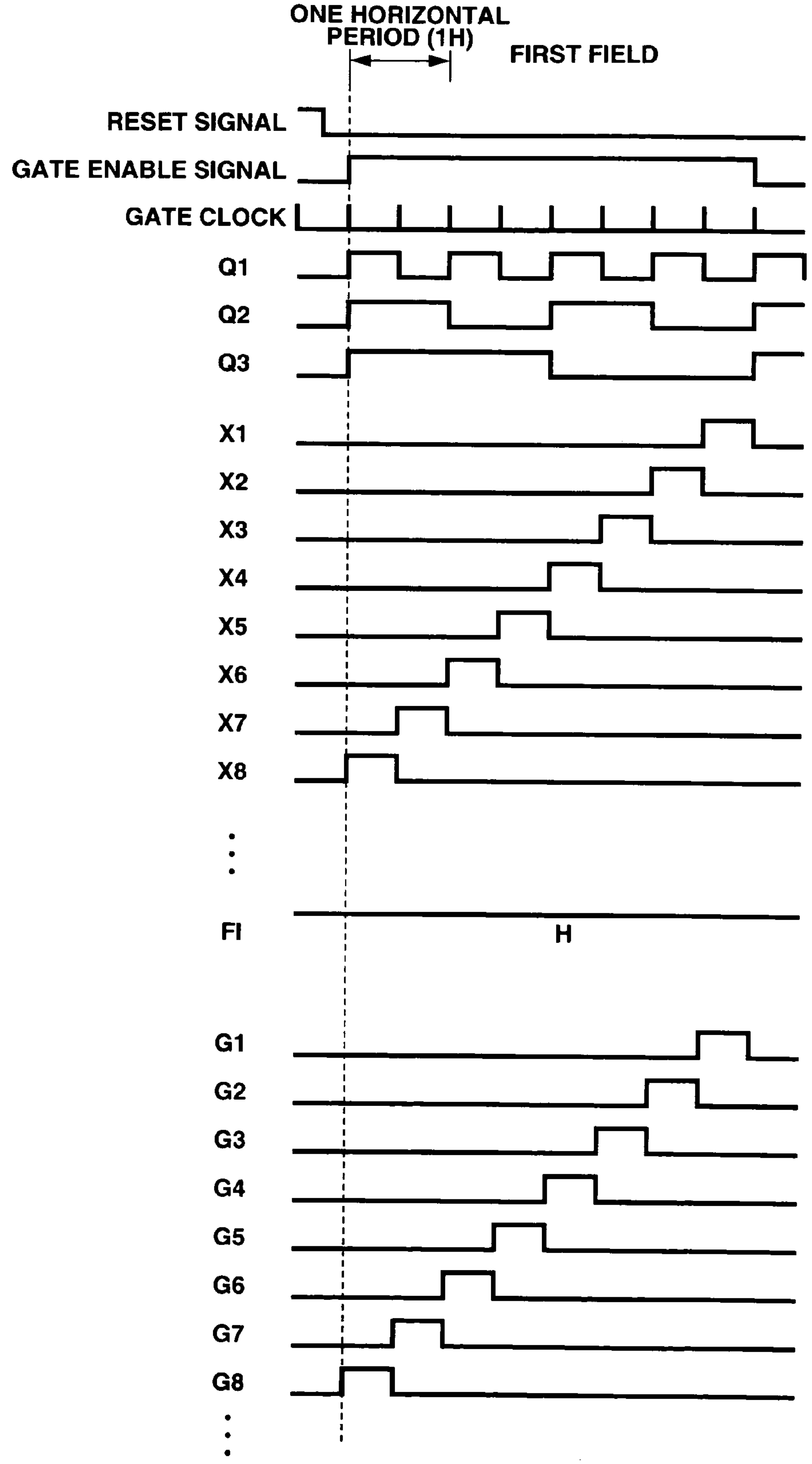
FIG. 7A is a timing chart of the first field in up-and-down inverse shifting in the gate driver block of FIG. 5.
Figure 7B:
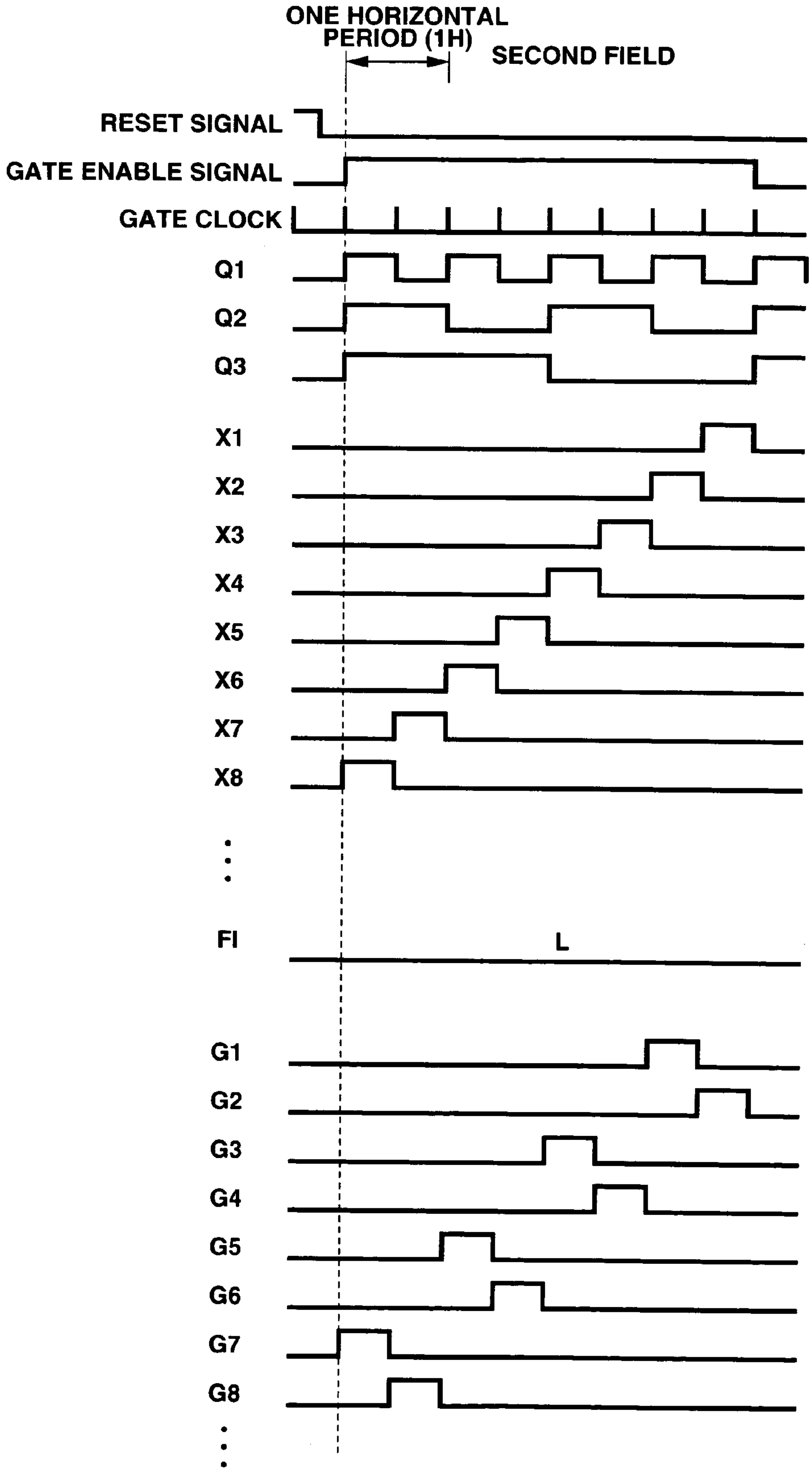
FIG. 7B is a timing chart of the second field in up-and-down inverse shifting in the gate driver block of FIG. 5.
Figure 8A:
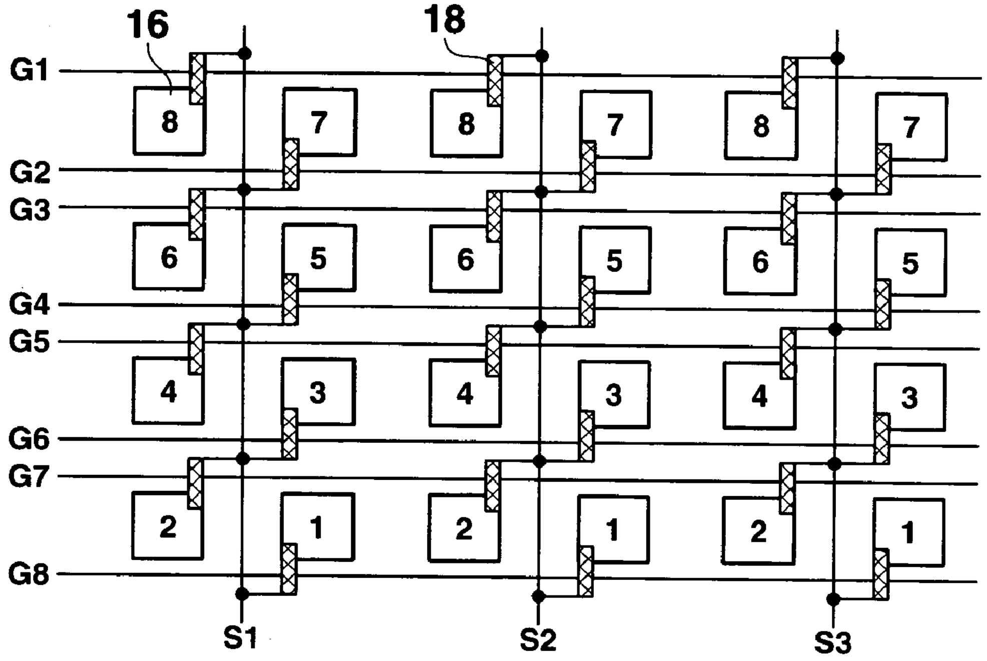
FIG. 8A is a view depicting the writing order of video signals in pixels in the first field in up-and-down inverse shifting according to the first embodiment.
Figure 8B:
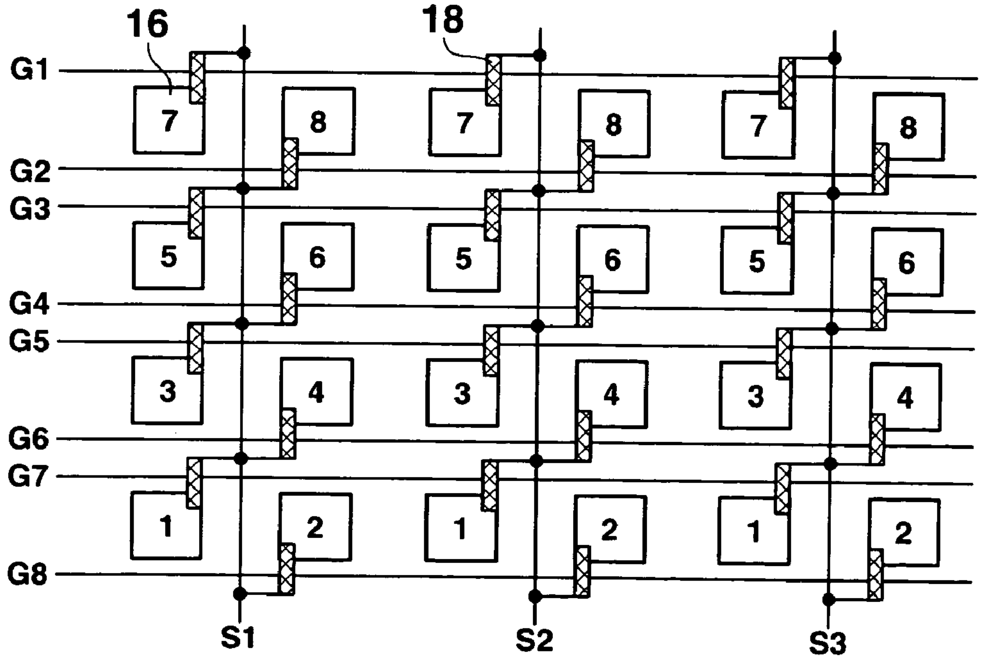
FIG. 8B is a view depicting the writing order of video signals in pixels in the second field in up-and-down inverse shifting according to the first embodiment.

FIG. 7A shows a timing chart of the first field in the up-and-down inverse shift in the gate driver block 22 configured as shown in FIG. 5, and FIG. 7B shows a timing chart in the second field in the up-and-down inverse shift. (In up-and-down inverse shifting, a reset signal rises earlier by one gate clock than in FIG. 6A and FIG. 6B.) FIG. 8A and FIG. 8B show the writing orders of the video signals Vsigs in pixels 16 in up-and-down inverse shifting. FIG. 8A shows the first field, and FIG. 8B shows the second field.

In up-and-down inverse shifting, in the first field, the H signals are output to the lines X1 to X8, respectively, in turn for a period equivalent to one pulse of the gate clock, in an order opposite to the order in which the H signals are output to the lines X1 to X8 in the non-inverse shifting, as shown in FIG. 7A. That is to say, in the gate driver block 22, the line X8 is set in the selection state, the line X7 is set in the selection state, the line X6 is set in the selection state, the line X5 is set in the selection state, the line X4 is set in the selection state, the line X3 is set in the selection state, the line X2 is set in the selection state, and the line X1 is set in the selection state, in that temporal order.

Here, in the first field, the H signal is supplied as the FI signal. Therefore, in a period that the line X8 is in the selection state, only the second AND gate 84 for the gate line G8 is brought into the selection state, and the gate line G8 is brought into the selection state via the OR gate 124 for the gate line G8 and the third AND gate 100 for the gate line G8 to be controlled by the gate enable signal. In a period in which the line X7 is in the selection state, only the first AND gate 78 for the gate line G7 enters the selection state, and the gate line G7 is brought into the selection state via the OR gate 122 for the gate line G7 and the third AND gate 98 for the gate line G7 to be controlled by the gate enable signal. In a similar manner, the gate lines G6-G1 are sequentially put into the selection state after the gate line G7.

Accordingly, in the first field, since the writing of the video signals Vsigs in the pixels 16 is executed in accordance with the order of the selection of the gate lines as shown in FIG. 7A, the writing is performed in the order depicted in FIG. 8A. Thereby, voltage leakages occur among pixels due to inter-pixel parasitic capacitance 204 at positions between adjacent pixels at which no source line exists, and the electrical potentials of the pixels 16 which are written earlier vary under the influence from the electrical potentials of the pixels 16 which are written later.

After entering the second field, with respect to the lines X1-X8, the gate driver block 22 selects the line X8, the line X7, the line X6, the line X5, the line X4, the line X3, the line X2 and the line X1, in that order as in the first field, as shown in FIG. 7B.

Here, in the second field, the L signal is supplied as the FI signal. Therefore, in a period in which the line X8 is selected, only the second AND gate 82 for the gate line G7 is brought into the selection state, and the gate line G7 is brought into the selection state through the OR gate 122 for the gate line G7 and the third AND gate 98 for the gate line G7 to be controlled by the gate enable signal. In a period in which the line X7 is selected, only the first AND gate 80 for the gate line G8 is brought into the selection state, and the gate line G8 is brought into the selection state through the OR gate 124 for the gate line G8 and the third AND gate 100 for the gate line G8 to be controlled by the gate enable signal in a similar manner, the gate driver block 22 selects the gate line G5, the gate line G6, the gate line G3, the gate line G4, the gate line G1, and the gate line G2, in that order, after the gate line G7.

Accordingly, in the second field, since the writing of the video signals Vsigs in the pixels 16 via the pixel wiring lines (the number of which has been reduced half) is performed in accordance with the order in which the gate lines are selected, which is reversed for each pair of gate lines corresponding to one row of pixels with respect to the order in which the gate lines in each pair are selected in the first field, (that is, in the second field, data is written in the pixels in the even columns first and then in the pixels in the odd columns for each row of pixels), as shown in FIG. 7B, the writing order is as shown in FIG. 8B. Thereby, also in the second field, voltage leakages occur among pixels due to the inter-pixel parasitic capacitance 204 at locations where a source line is not provided between adjacent pixels, and the electrical potentials of the pixels 16 which are written earlier vary under the influence of the electrical potentials of the pixels 16 which are written later.

However, the pixels 16 whose electrical potentials vary in the second field differ from the pixels 16 whose electrical potentials vary in the first field. That is, in the second field, since the writing order of the video signals is made to be reverse with respect to the writing order of the video signals of the first field, the writing order in the adjacent pixels 16 having no source line therebetween is reversed in the second field with respect to the first field. Therefore, the pixel positions at which the difference in electrical potentials occur are made opposite between the first and the second fields, and as a result, the deviations of the pixel potentials are averaged temporally and the display unevenness is reduced.

As mentioned above, according to the first embodiment of the invention, averaging the difference in electrical potentials temporally by changing the selection order of the two gate lines corresponding to each pair of two adjacent pixels connected to different source lines (that is, changing the selection order of the gate lines in each pair of gate lines corresponding to one row of pixels) by the gate driver block 22 in each field enables decreasing the display unevenness.

Since the source driver block 24 outputs the combinations of the video signals Vsigs, based on the information to output to the plurality of source lines to be displayed, by changing the order of data of the odd-numbered columns and the even-numbered columns in response to the shifting of the selection order of the gate lines in the second field as shown in FIG. 3, the pixels may be displayed without disturbances. Although the detailed circuit configuration regarding the changes in output order of the combinations of the video signals Vsigs in the second field will not be illustrated specifically, for example, the TG unit logic circuit 28 may hold the combinations of the video signals Vsigs of at least one line to supply the reversed order of data of the odd-numbered columns and the even-numbered columns to the source driver block 24, or the source driver block 24 may change the order of the data thereof. Alternatively, the source which supplies the video signals Vsigs to the active matrix display device may supply the data of the odd-numbered columns and the even-numbered columns by changing the order of the data in the second field. (A basically similar operation is performed in the operations in the up-and-down inverse shift.) (In the up-and-down inverse shift, a field memory is required; however when the inverse shift is not performed, the output of the combinations may be achieved by a line memory.)

MODIFIED EXAMPLE

Figure 9:
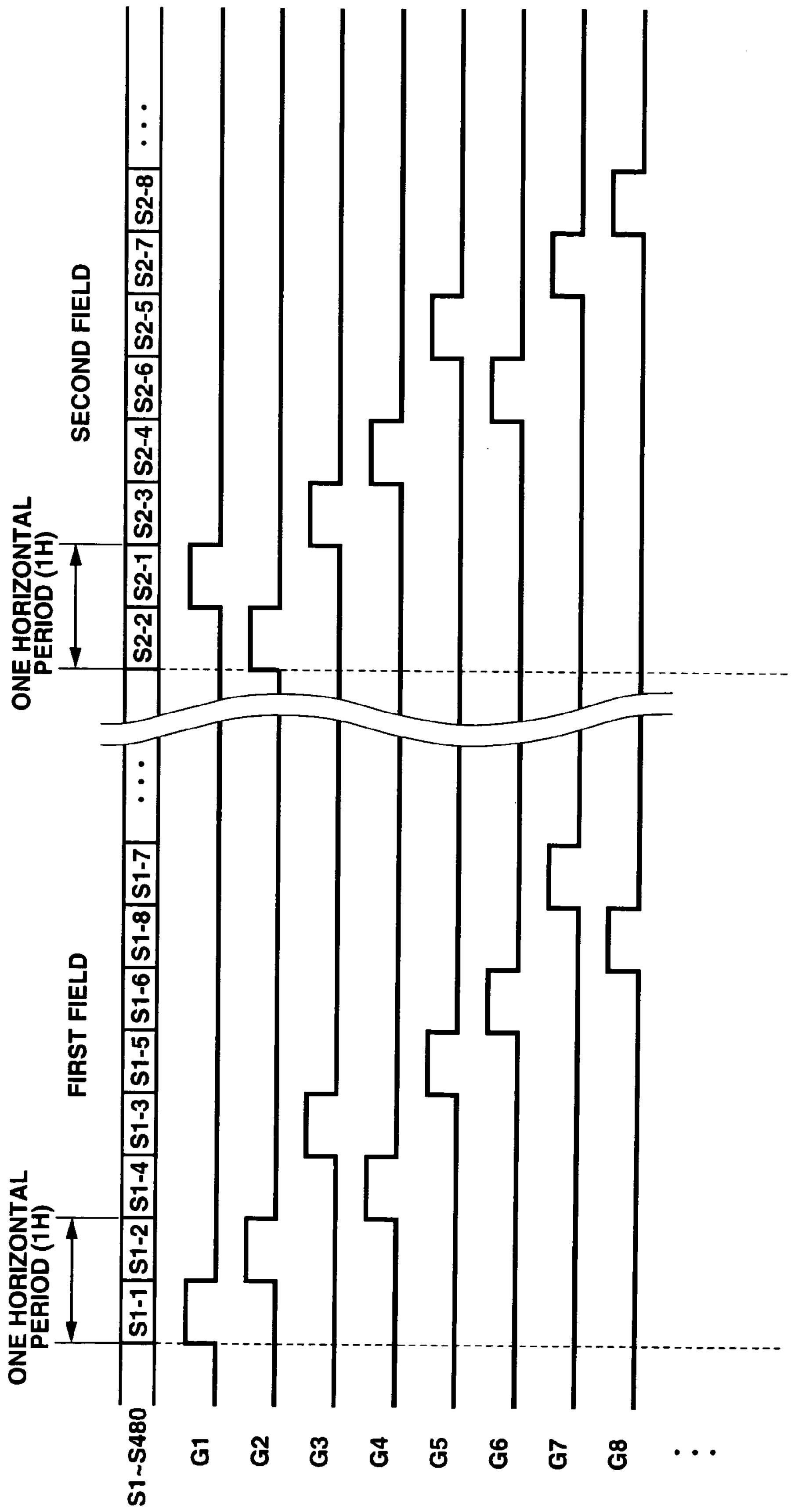
FIG. 9 is a timing chart consisting of the output order of combinations of video signals based on information to be output to a plurality of source lines to be displayed, and the selection order of a plurality of gate lines in an modified example of the first embodiment.
Figure 10A:
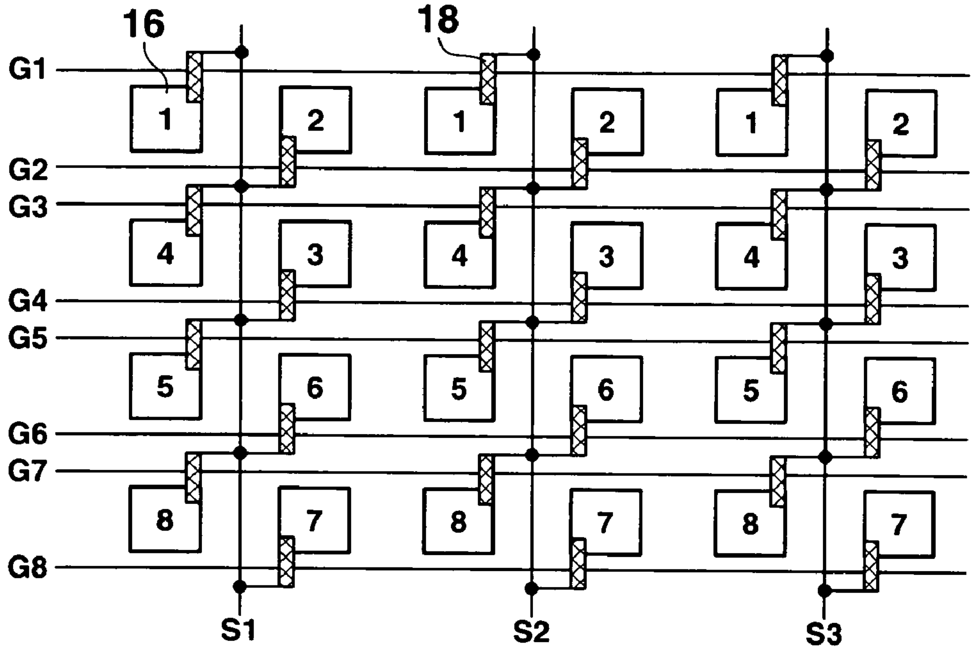
FIG. 10A is a view depicting the writing order of video signals in pixels of a first field in the modified example of the first embodiment.
Figure 10B:
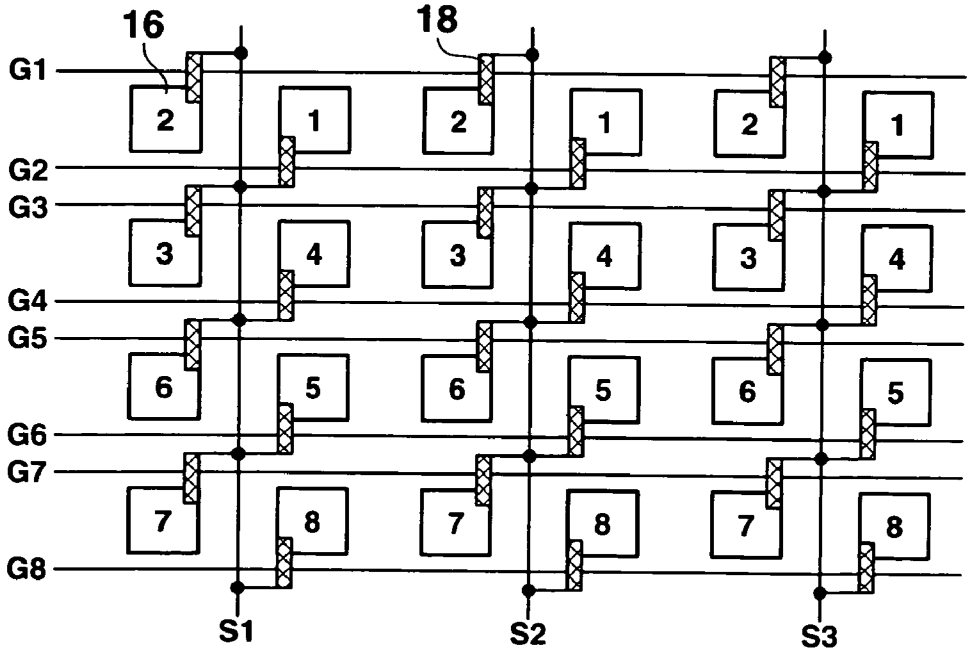
FIG. 10B is a view depicting the writing order of video signals in pixels of a second field in the modified example of the first embodiment.

In the first embodiment, the order of the sequential selection of the two gate lines corresponding to one row of pixels (corresponding to two adjacent pixels connected to different source lines) is switched in every field. The gate driver block 22 may additionally switch the order of the sequential selection every two gate lines (that is, every 1H period, or every two scanning periods), as shown in FIG. 9. The writing order of the video signals Vsigs into pixels 16 in the first field and the second field is thus as depicted in FIG. 10A and FIG. 10B, respectively. Thereby, the pixels to be influenced by the parasitic capacitance do not form a vertical line even within the same field, and as a result, vertical stripes may become inconspicuous.

Figure 11:
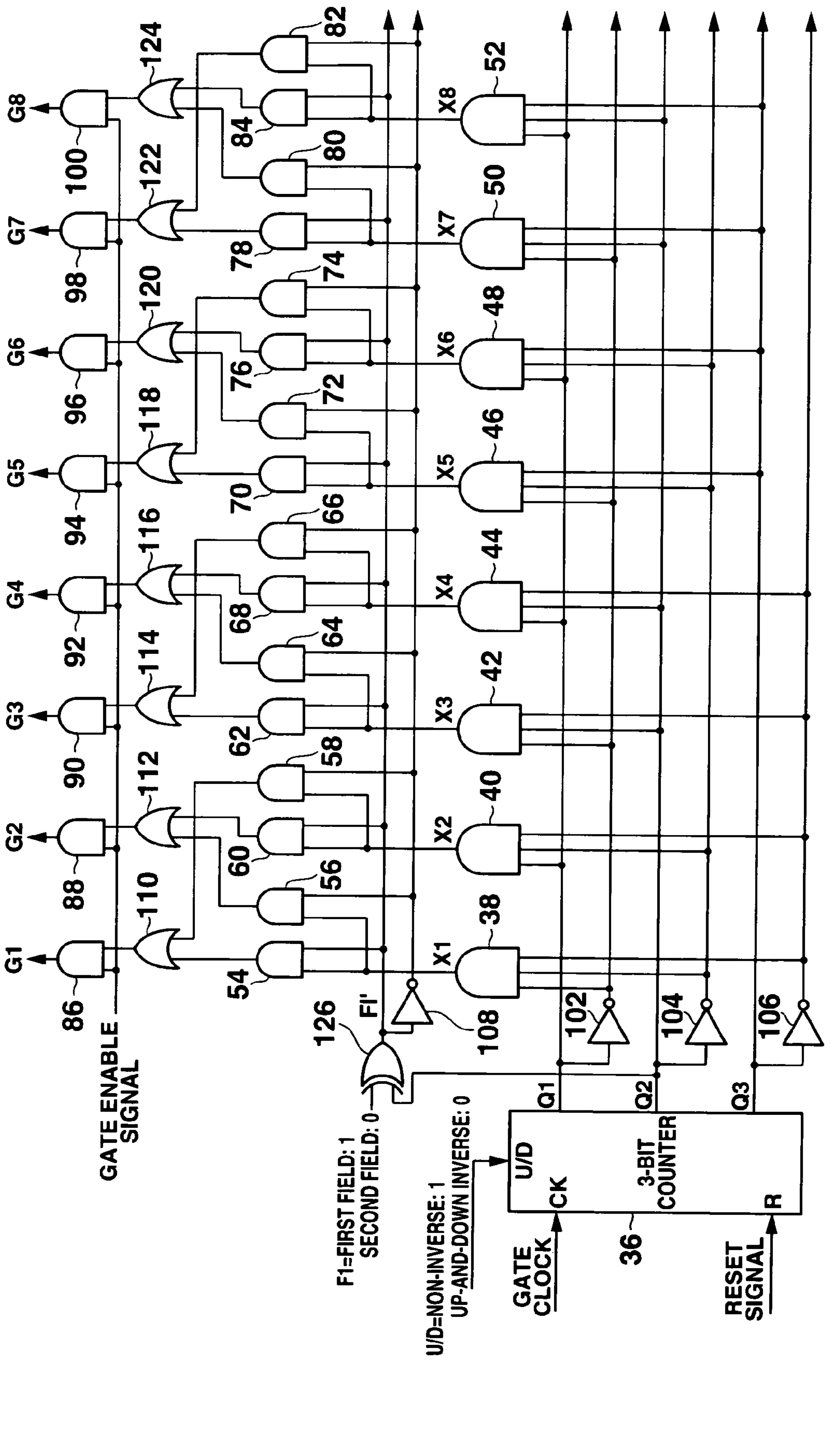
FIG. 11 is a view depicting a concrete configuration of a gate driver block in a modified example of the first embodiment.

FIG. 11 illustrates a circuit example which actualizes such drive control. This circuit example is the same as that of FIG. 5 except that an XOR (exclusive or) gate 126 is added, and the FI signal and the Q2 signal are input into the XOR gate 126 to output an FI' signal in place of the FI signal in the structure of FIG. 5.

Figure 12A:
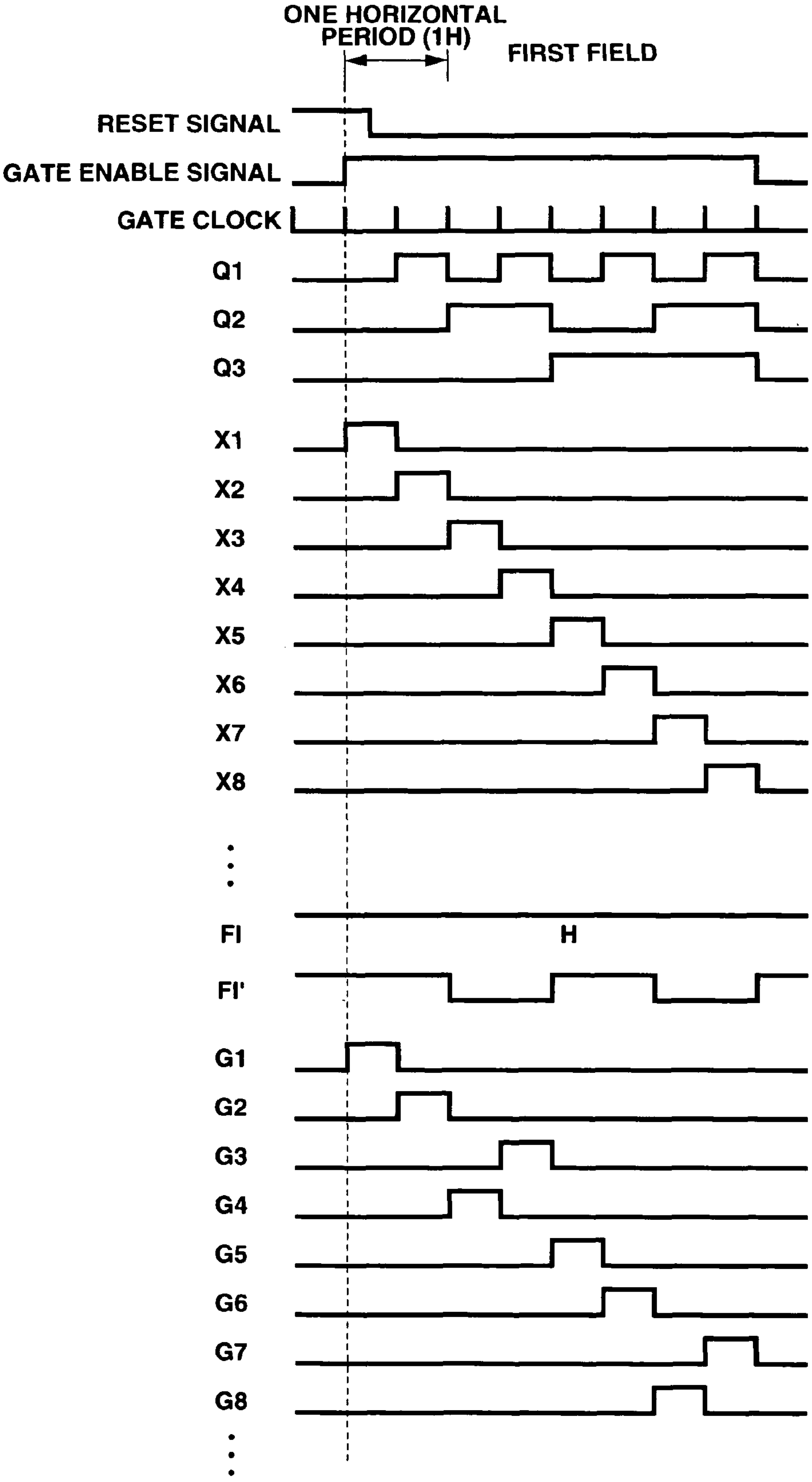
FIG. 12A is a timing chart in a first field in non-reverse shifting of the gate driver block in FIG. 11.
Figure 12B:
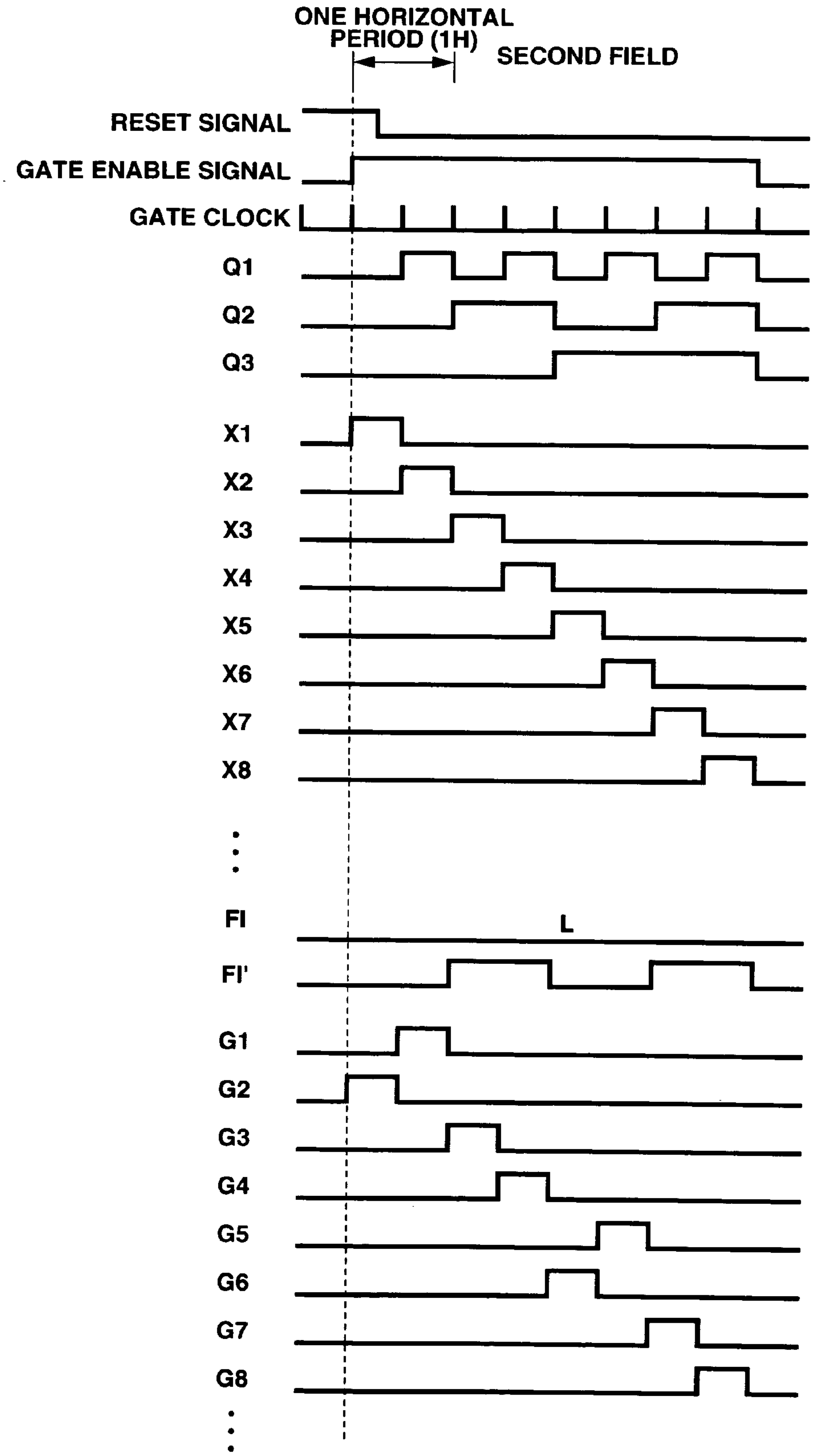
FIG. 12B is a timing chart in a second field in non-reverse shifting of the gate driver block in FIG. 11.
Figure 13A:
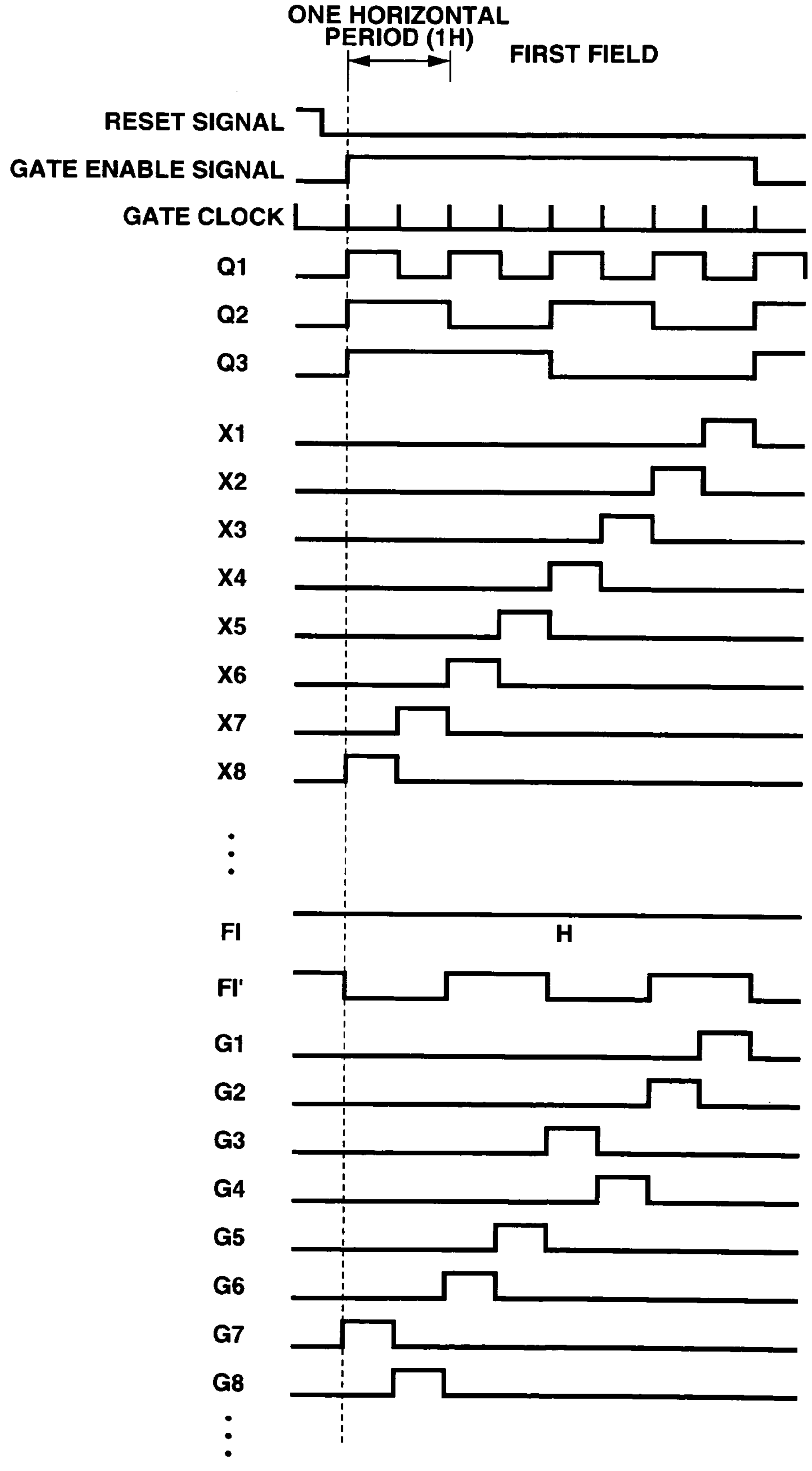
FIG. 13A is a timing chart in the first field in up-and-down inverse shifting of the gate driver block in FIG. 11.
Figure 13B:
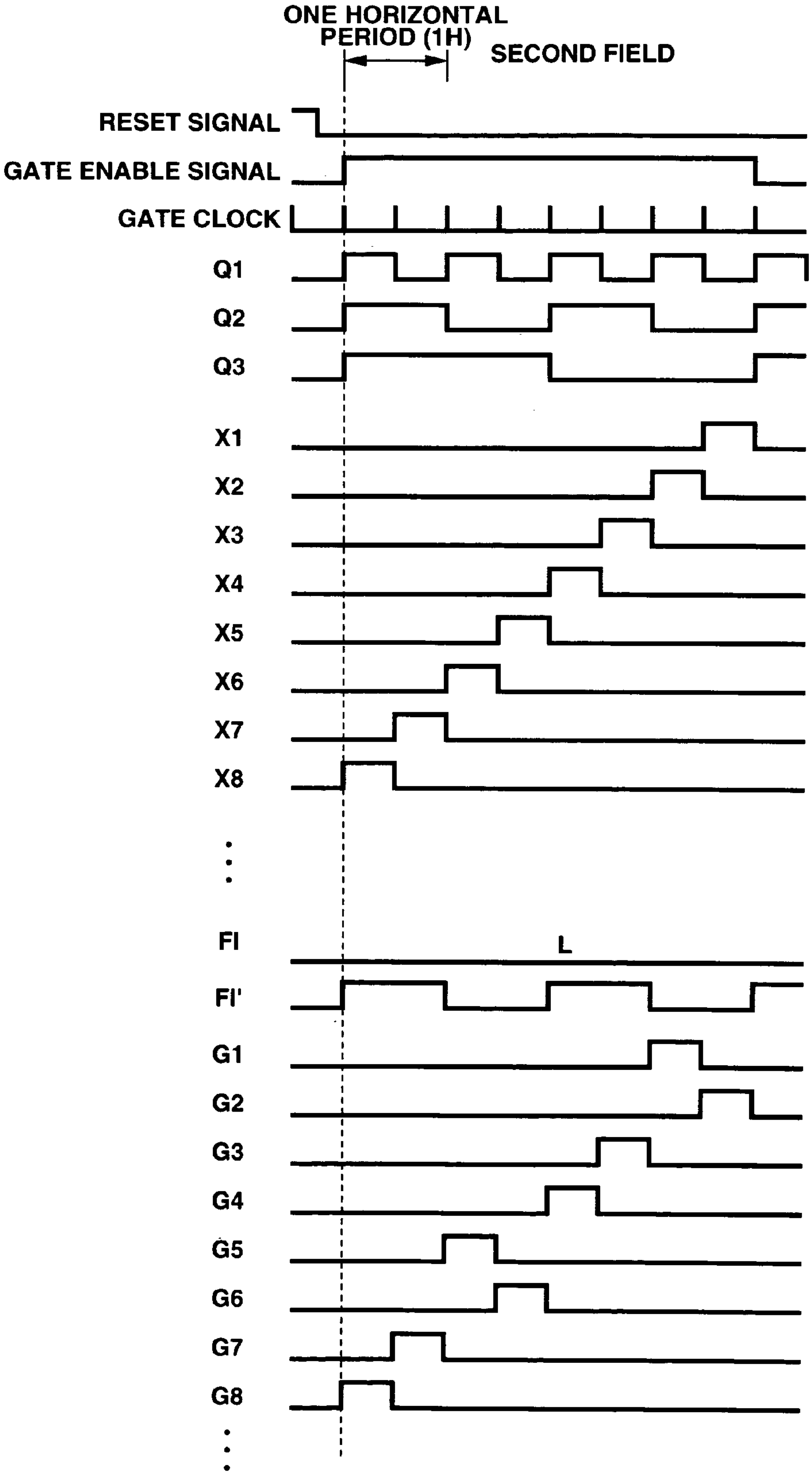
FIG. 13B is a timing chart in the second field in up-and-down inverse shifting of the gate driver block in FIG. 11.

FIG. 12A and FIG. 12B illustrate aspects of circuit operations of FIG. 11 in non-inverse shifting for the first and second fields, respectively. FIG. 13A and FIG. 13B illustrate aspects of circuit operations of FIG. 11 in up-and-down inverse shifting for the first and second fields, respectively. (When up-and-down inverse shifting is performed, reset signals fall earlier than those of FIG. 12A and FIG. 12B by one gate clock.)

Preferably, according to a modification of the first embodiment, the selection order of the gate lines is switched every two gate lines (that is, every 1H period or every two scanning period) and each field. This drive control may be actualized by applying a simple modification of the gate driver block in FIG. 5, as shown in FIG. 11.

Figure 14:
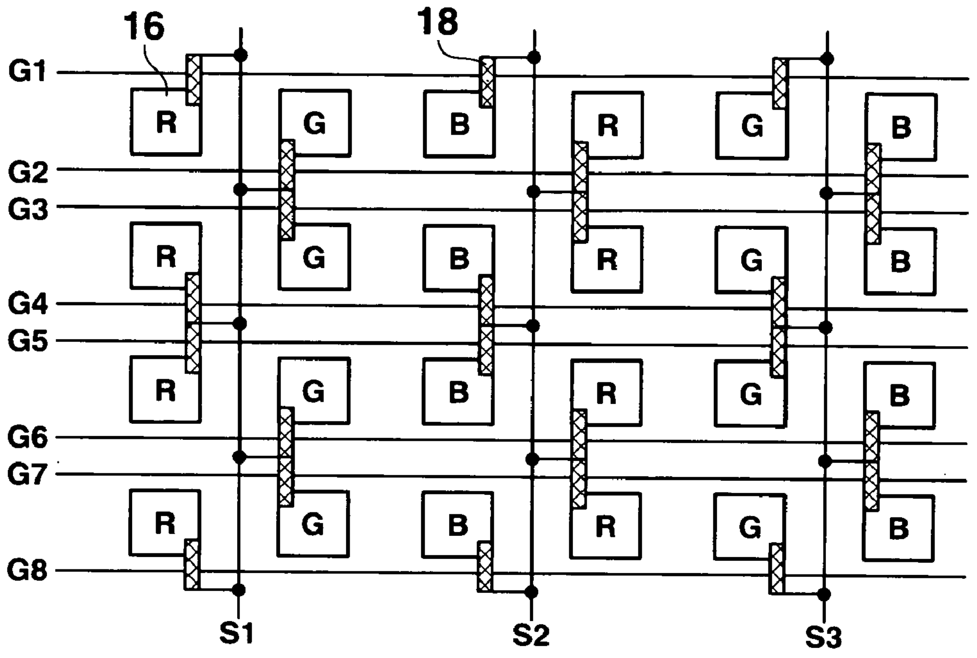
FIG. 14 is a schematic view of another wiring arrangement of pixel wiring lines on an LCD panel (a display panel)
Figure 15A:
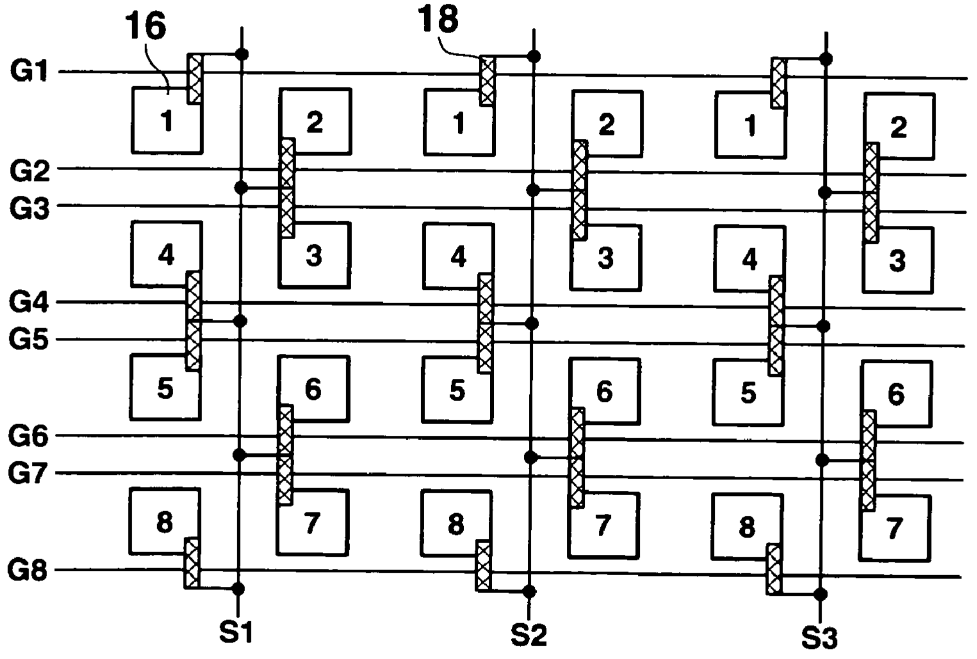
FIG. 15A is a view depicting the writing order of video signals in pixels in a first field with the pixel wiring lines of FIG. 14.
Figure 15B:
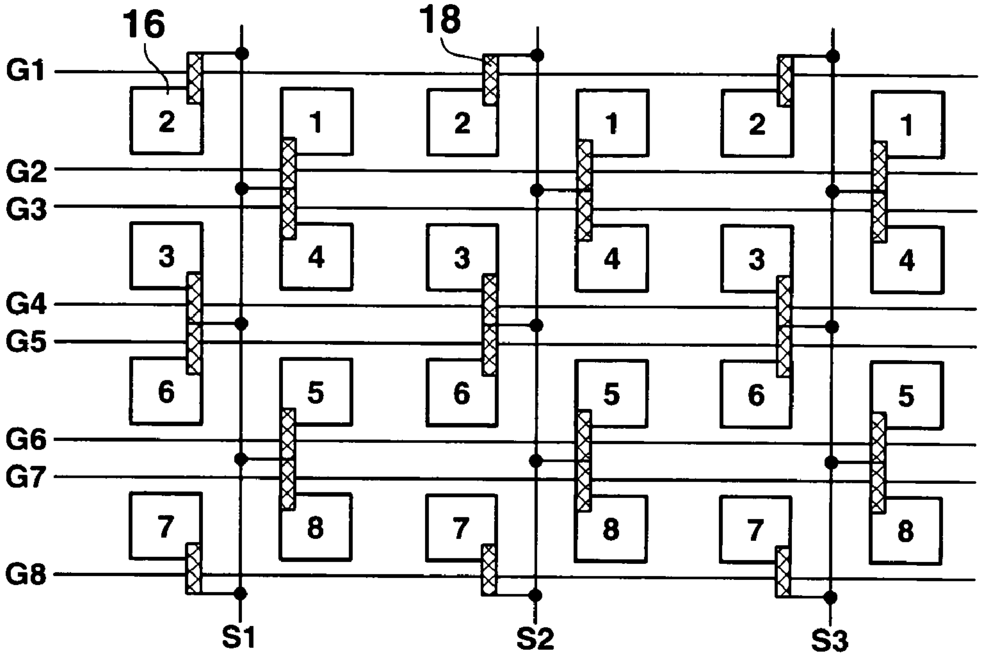
FIG. 15B is a view depicting the writing order of video signals in pixels in a second field with the pixel wiring lines of FIG. 14.

This drive control may also be applied to a LCD panel 10 having a configuration in which the pixels and the TFTs are wired as depicted in FIG. 14. With this structure as well, the gate driver block selects the gate lines sequentially so that the writing orders of the pixels are as shown in FIG. 15A (for the first frame) and FIG. 15B (for the second frame). In the case of the pixel wiring shown in FIG. 14, the circuit example depicted in FIG. 5 can be used to enable the driving. The circuit example shown in FIG. 5 can be advantageously used as the gate driver of an active matrix display device wherein one source line is provided for each pixel column and one gate line is provided for each pixel row.

As described above, according to this modified example, by performing such drive control, since the vertical stripes of display unevenness becomes zigzag lines even in within the same field, an effect is produced such that the vertical stripes themselves become inconspicuous even within one field.

It is also possible to switch the selection order of the gate lines in each pair of gate lines corresponding to one row of pixels within each field without changing the selection order of the gate lines in each pair of gate lines corresponding to one row of pixels between the first field and the second field, since switching the selection order of the gate lines within the field causes the vertical stripes to become zigzag stripes, which causes the vertical stripes to become inconspicuous. In this case, the FI signal may be fixed in FIG. 11 (instead of alternating as shown in FIGS. 12A and 12B. However, it is preferable to perform both switching of the selection order of the gate lines in each pair of gate lines corresponding to one row of pixels within the field and to perform switching of the selection order of the gate lines in each pair of gate lines corresponding to one row of pixels between the first field and the second field in the manner described above.

Here, although the selection order is switched for every two gate lines, the selection order may be switched for every 2j (j is an integer equal to two or more) gate lines (it is preferable for the period to be short).

Second Embodiment

According to the second embodiment, the pixels of the active matrix display device are arranged in a delta arrangement, in which three kinds of pixels of (R, G and B) are arranged in a delta shape, instead of the stripe arrangement in which the pixels are arrayed vertically and horizontally as shown in FIG. 1B.

Figure 16:
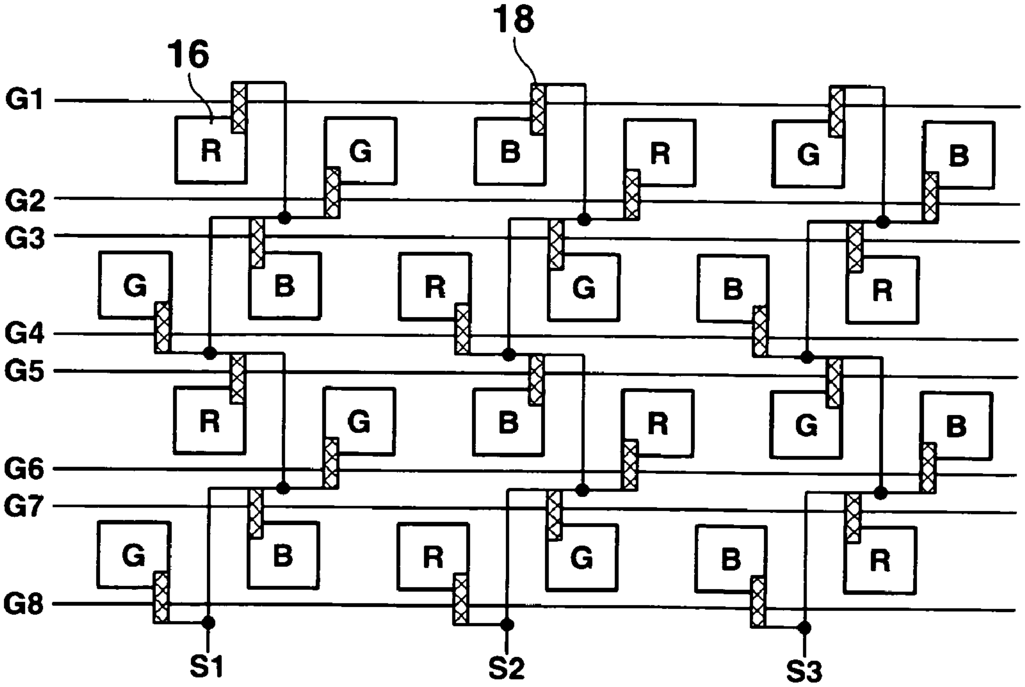
FIG. 16 is a schematic view of pixel wiring lines of an LCD panel which employs a delta arrangement, according to a second embodiment of the present invention.

FIG. 16 is a schematic view of the pixel wiring lines of the LCD panel with such a delta arrangement. In this delta arrangement, a plurality of source lines S1-S480 are not formed in a straight-line shape like the stripe arrangement as shown in FIG. 1B, but rather are formed in zigzags so as to twist among the pixels 16, and the pixels 16 corresponding to the odd-numbered rows and the pixels 16 corresponding to the even-numbered rows are arranged so as to deviate from each other by half of a pitch between adjacent pixels in the column directions as shown in FIG. 16.

Figure 17A:
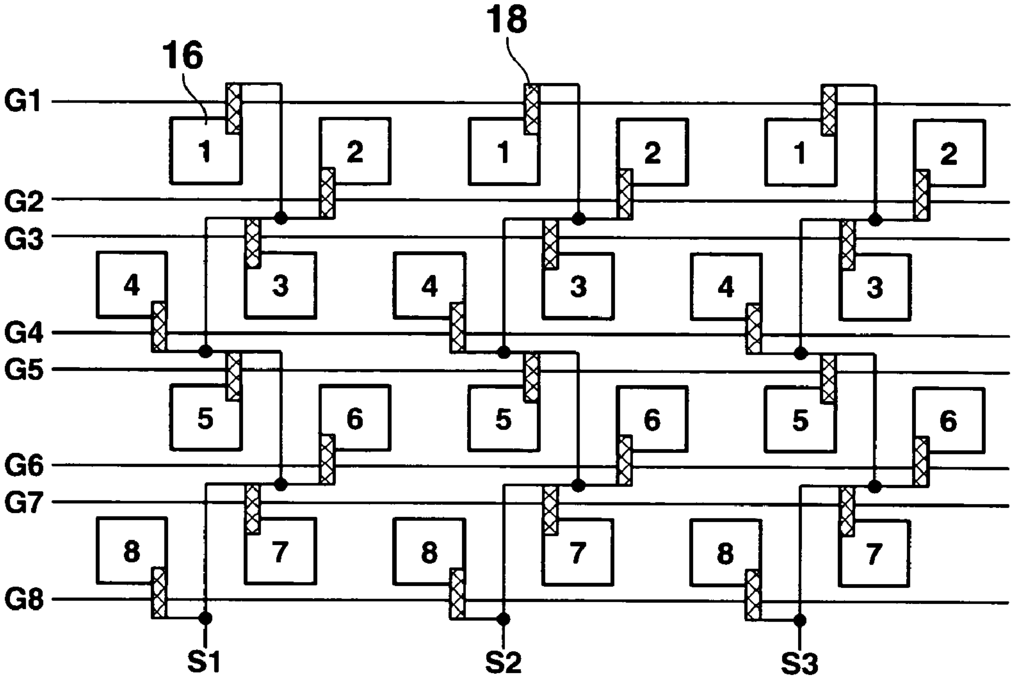
FIG. 17A is a view depicting the writing order of video signals in pixels in a first field in non-inverse shifting according to the second embodiment.
Figure 17B:
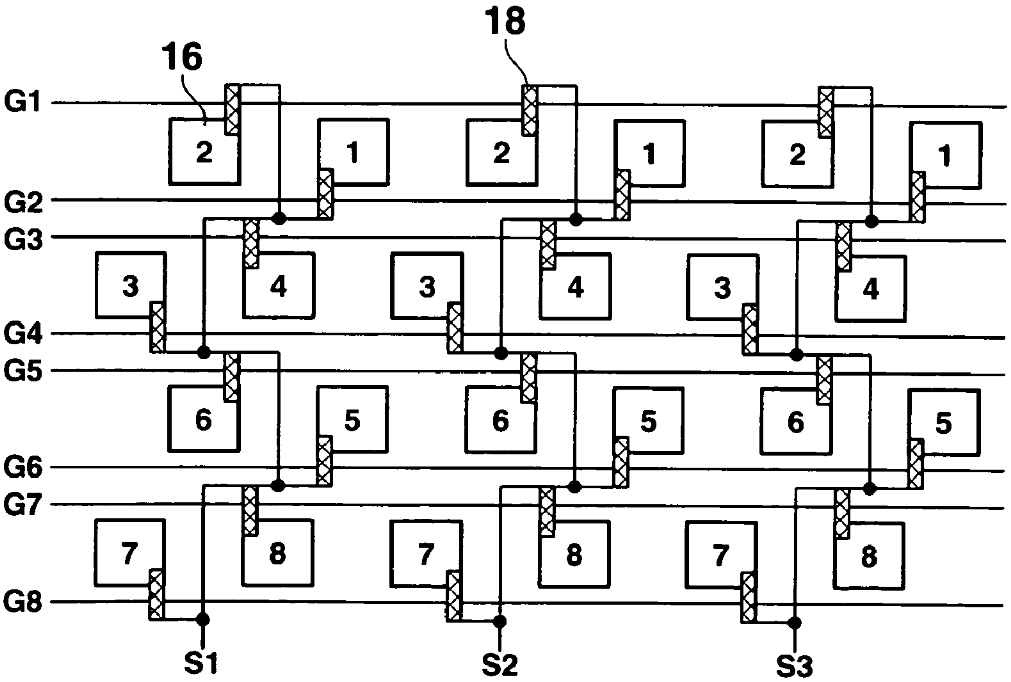
FIG. 17B is a view depicting the writing order of video signals of pixels in a second field in non-inverse shifting according to the second embodiment.

FIG. 17A shows the writing order of the video signals Vsigs in pixels 16 in the first field of the non-inverse shift in the second embodiment, and FIG. 17B shows the writing order of the video signals Vsigs in pixels 16 in the second field in the non-inverse shift in the second embodiment.

According to the second embodiment, the driver circuit 12 changes the selection order of the plurality of gate lines G1-G480 in each field in the manner shown in FIG. 3.

That is, in the first field, the gate driver block 22 performs the first drive control to sequentially select one gate line very half horizontal period such that the plurality of gate lines G1-G480 are selected in accordance with the numbered order. The source driver block 24 outputs the combinations of the video signals Vsigs to be written in the pixels 16 corresponding to the selected gate lines, respectively, to the plurality of source lines S1-S480 for a half horizontal period at a time. Accordingly, in the first field, since the writing of the video signals Vsigs to each pixel 16 is executed in the order of the gate lines G1-G480 as depicted in FIG. 3, the writing order is as shown in FIG. 17A. Thereby, the voltage leakages occur among pixels due to the inter-pixel parasitic capacitance 204 at locations where a source line is not provided between adjacent pixels, and the electrical potentials of the pixels 16 written earlier are varied under the influence of the electrical potentials of the pixels 16 written later.

In the second field, the gate driver block 22 performs the second drive control to reverse the selection order of the two gate lines in each pair of gate lines corresponding to one row of pixels (each pair of gate lines corresponding to two adjacent pixels 16 connected to the different source lines) in comparison with the first field. The source driver block 24 outputs the combinations of the video signals Vsigs to be written into the pixels 16 corresponding to the selected gate lines, respectively, to the plurality of source lines S1-S480 for the half horizontal period at a time in response to the selection order. Therefore, in the second field, since the writing of the video signals Vsigs in each pixel 16 is executed for adjacent pixels connected to different source lines in an order which is reversed with respect to the first field, in accordance with the selection order of the gate lines, as depicted in FIG. 3, the writing order is as shown in FIG. 17B. Thereby, also in the second field, the voltage leakages occur among pixels due to the inter-pixel parasitic capacitance 204 at locations where a source line is not provided between adjacent pixels, and the electrical potentials of the pixels 16 written earlier vary under the influence of the electrical potentials of the pixels 16 written later.

However, the pixels 16 whose electrical potentials are varied in the second field differ from the pixels 16 whose electrical potentials are varied in the first field. That is, since the writing order of the video signals Vsigs in the second field is reversed with respect to the writing order of the video signals Vsigs in the first field, the writing order in the adjacent pixels 16 with no source line therebetween is reversed between the first and the second fields. Therefore, the positions of the pixels at which the electrical potential differences occur are reversed in the first and the second fields, and as a result, the deviation between the pixel potentials are temporally averaged and display unevenness is reduced.

Figure 18A:
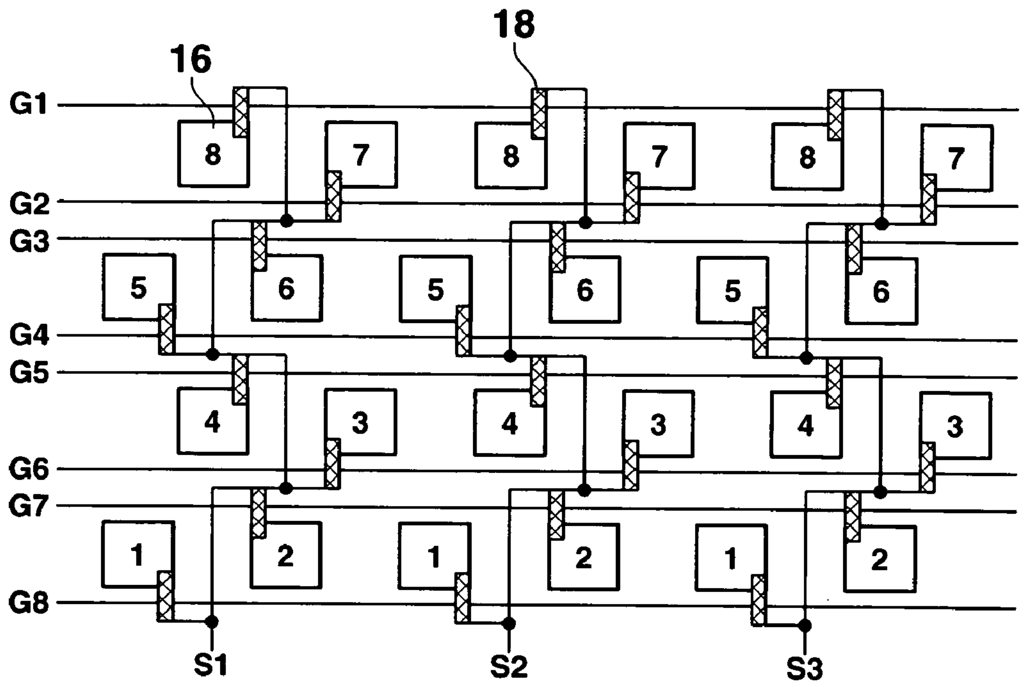
FIG. 18A is a view depicting the writing order of video signals in pixels in the first field in up-and-down inverse shifting according to the second embodiment.
Figure 18B:
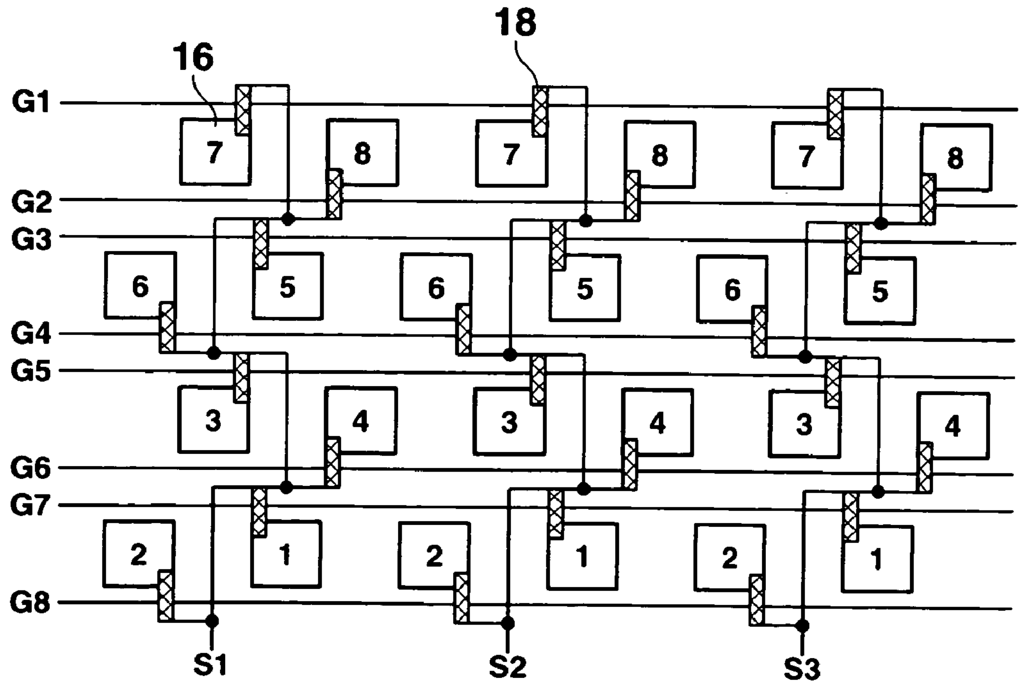
FIG. 18B is a view depicting the writing order of video signals in pixels in the second field in up-and-down inverse shifting according to the second embodiment.
Figure 19:
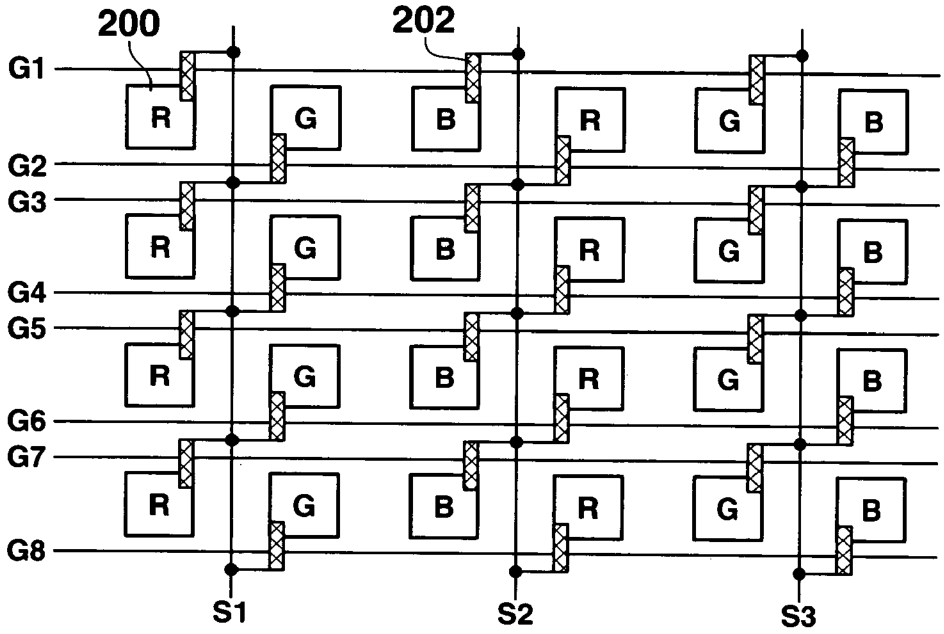
FIG.19 PRIOR ART
FIG. 19 is a schematic view depicting pixel wiring lines of a display panel in which the number of source lines is reduced by half in a conventional active matrix display device.
Figure 20:
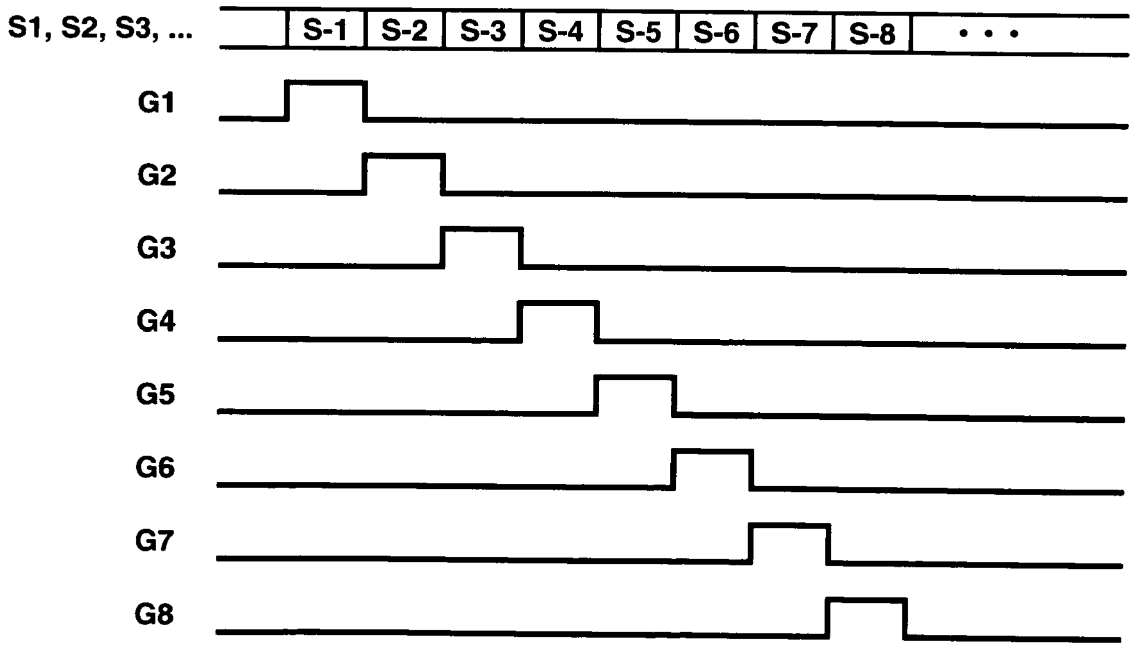
FIG.20 PRIOR ART
FIG. 20 is a scanning timing chart of the pixel wiring lines of FIG. 19.
Figure 21:
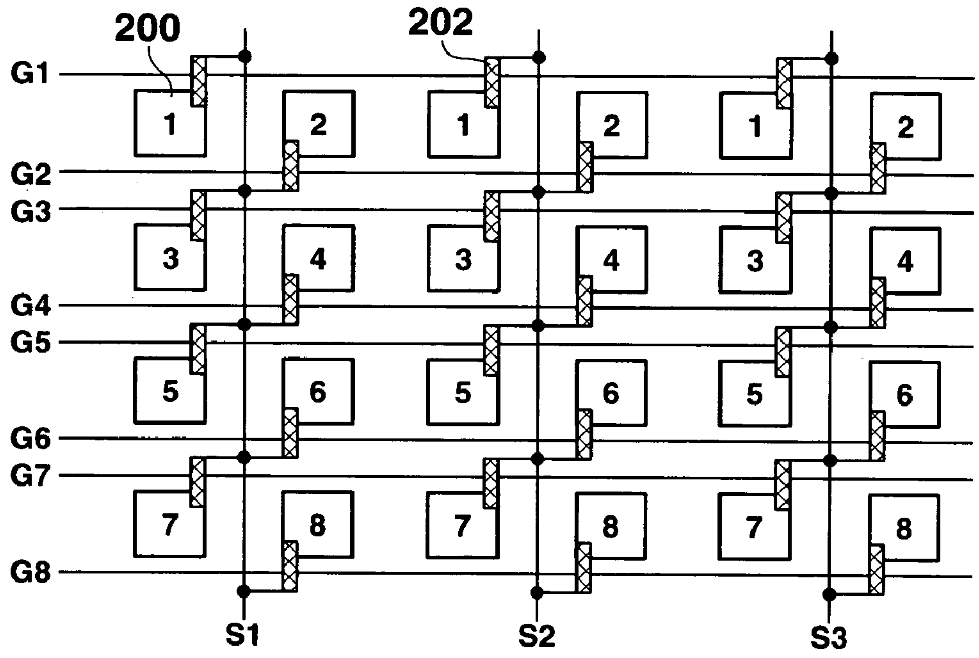
FIG.21 PRIOR ART
FIG. 21 is a view depicting an order of writing video signals to pixels with the pixel wiring lines of FIG. 19.
Figure 22:
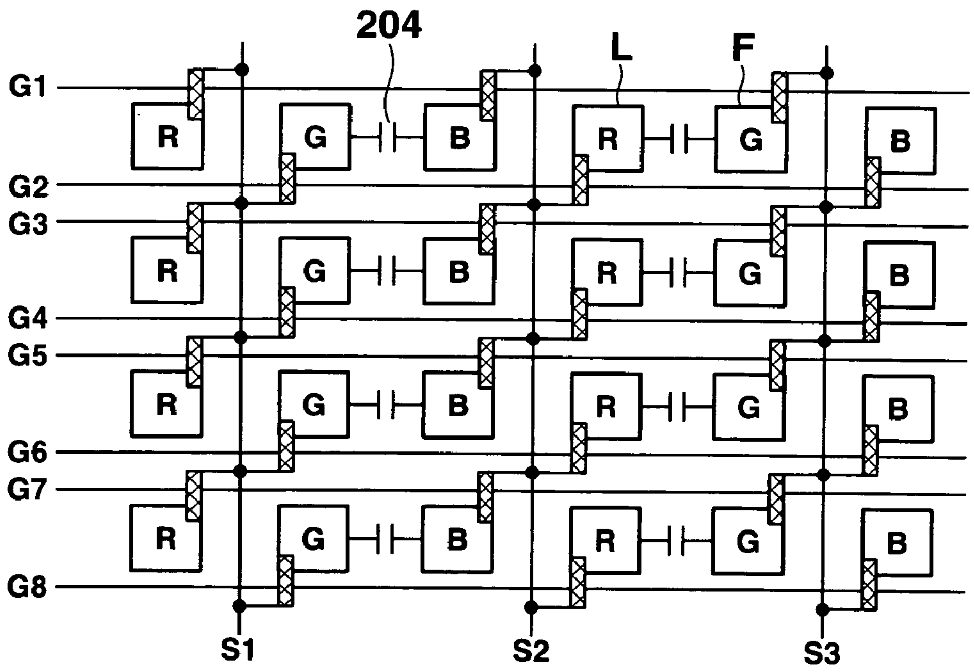
FIG.22 PRIOR ART
FIG. 22 is a view depicting an equivalent circuit of a display panel of FIG. 19.
Figure 23:
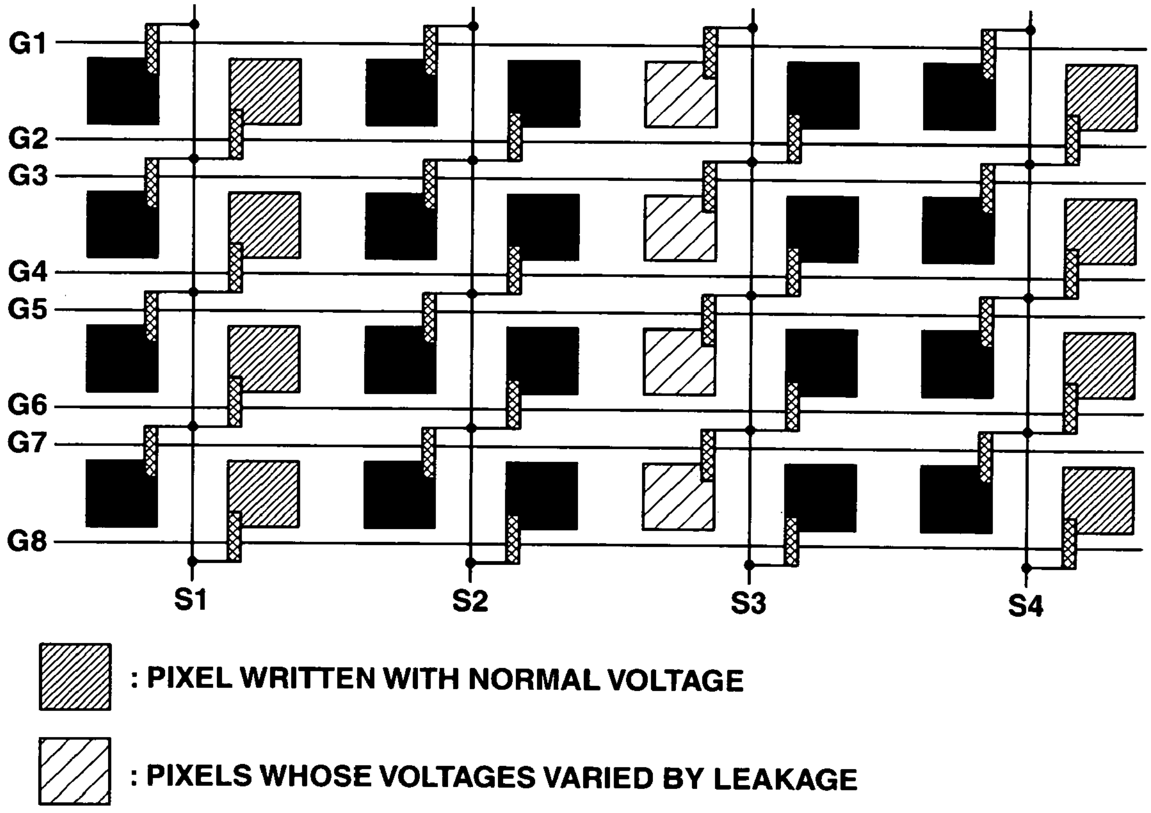
FIG.23 PRIOR ART
FIG. 23 is a view depicting an example of display unevenness on the display panel of FIG. 19.
Figure 24:
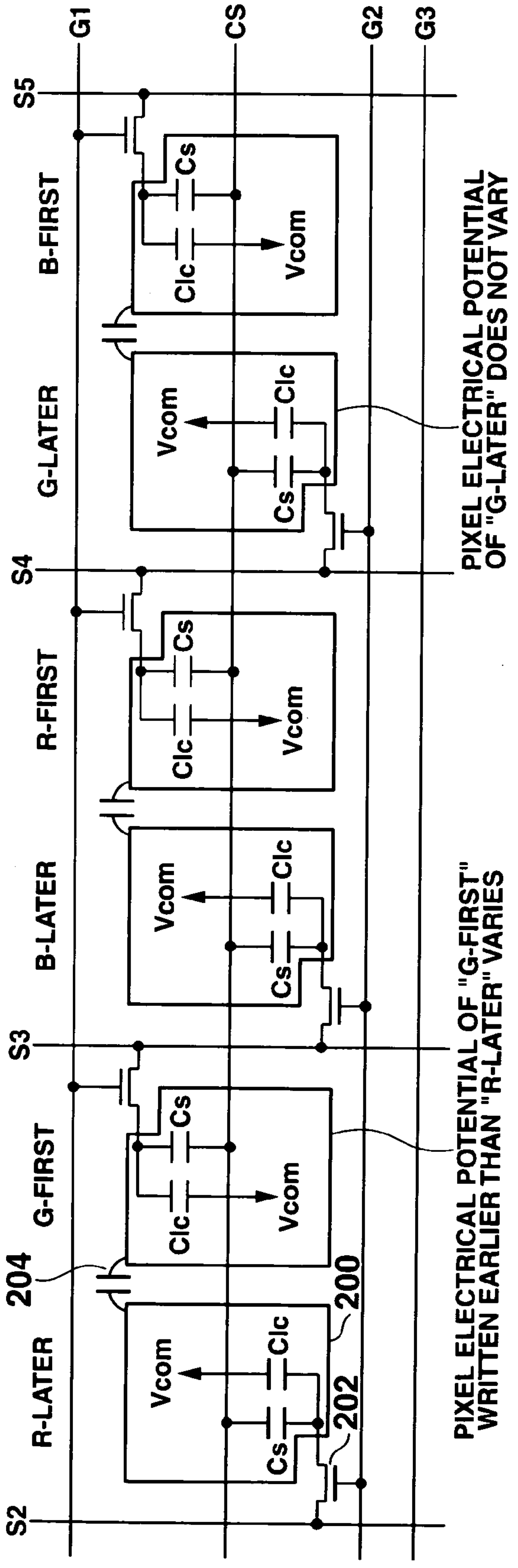
FIG.24 PRIOR ART
FIG. 24 is a view depicting configurations of respective pixels when a TFT LCD panel is used as the display panel.
Figures 25A, 25B:
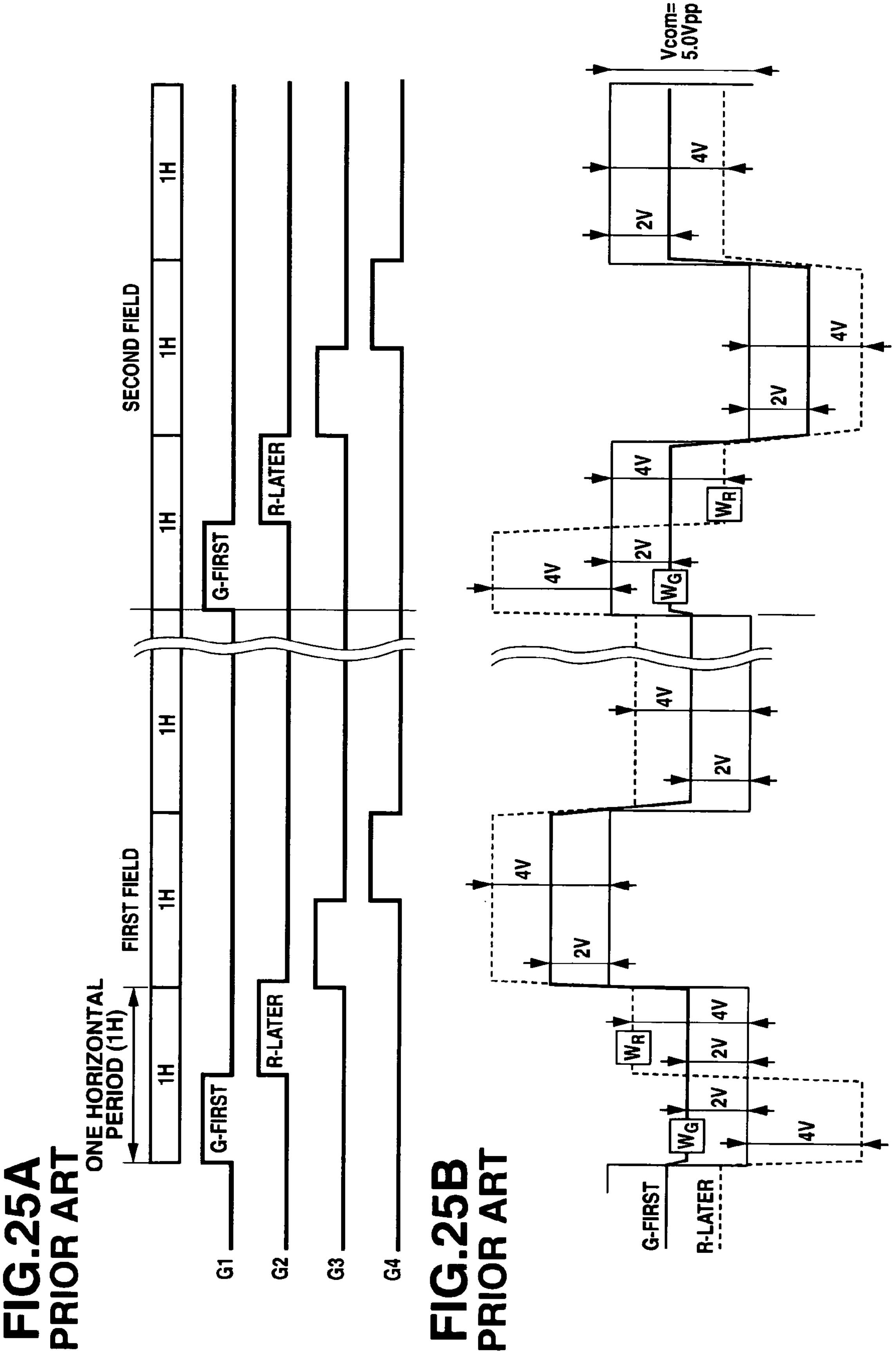
FIG.25A PRIOR ART
FIG.25B PRIOR ART
FIG. 25A is a scanning timing chart.
FIG. 25B is a view depicting pixel electrical potential waveforms in performing the horizontal line inversion driving in the case in which inter-pixel parasitic capacitance does not exist.
Figures 26A, 26B:
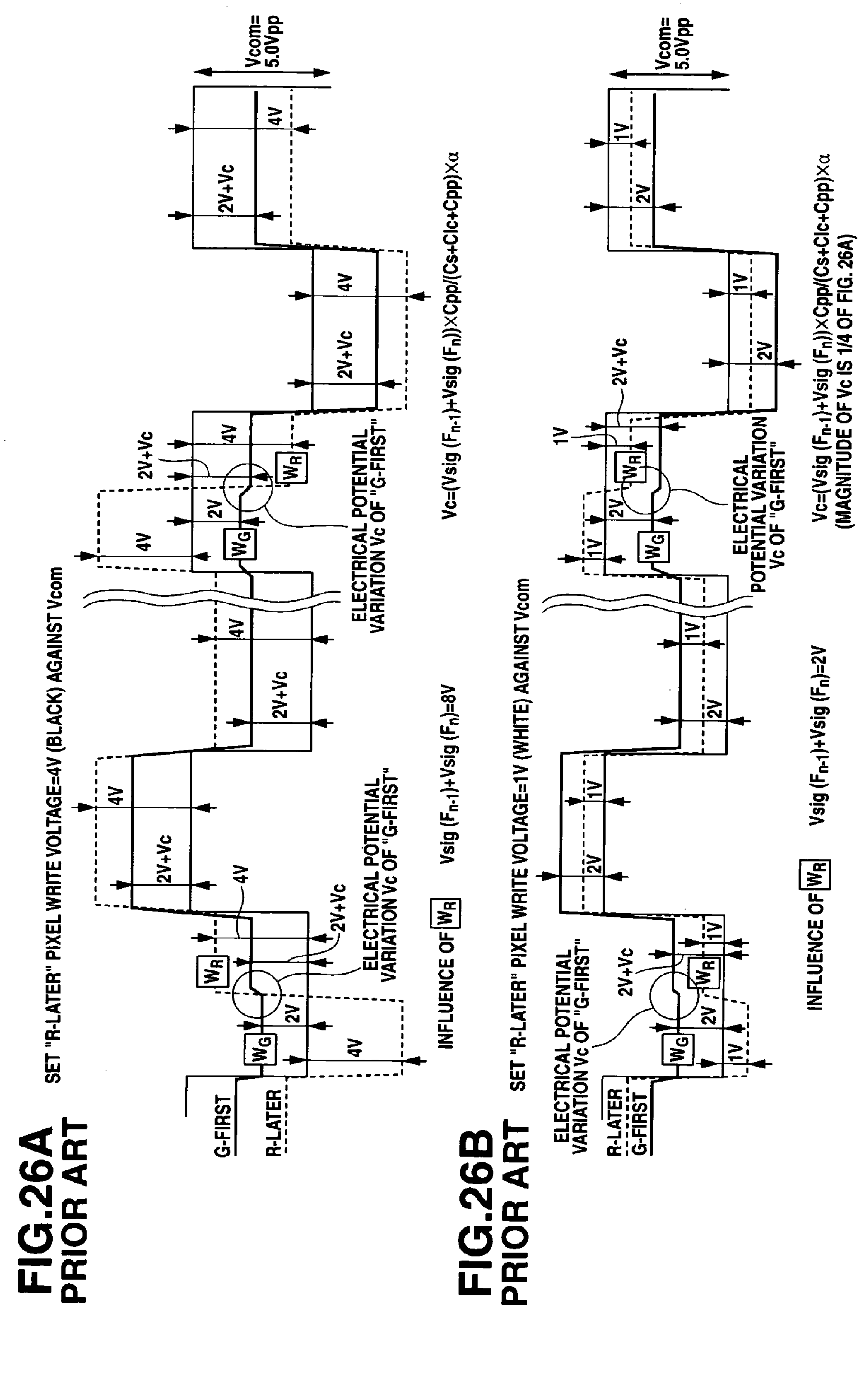
FIG.26A PRIOR ART
FIG.26B PRIOR ART
FIG. 26A is a view depicting pixel electrical potential waveforms, in which amplitude of a common voltage is set to 5.0V, a write voltage of a pixel G-first is set to 2.0V against the common voltage, and a write voltage of pixel R-later is set to 4.0V against the common voltage, in performing the horizontal line inversion driving, taking inter-pixel parasitic capacitance into account.
FIG. 26B is a view depicting pixel electrical potential waveforms, in which amplitude of a common voltage is set to 5.0V, a write voltage of a pixel G-first is set to 2.0V against the common voltage, and a write voltage of pixel R-later is set to 1.0V against the common voltage, in performing the horizontal line inversion driving, taking inter-pixel parasitic capacitance into account.
Figure 27A:
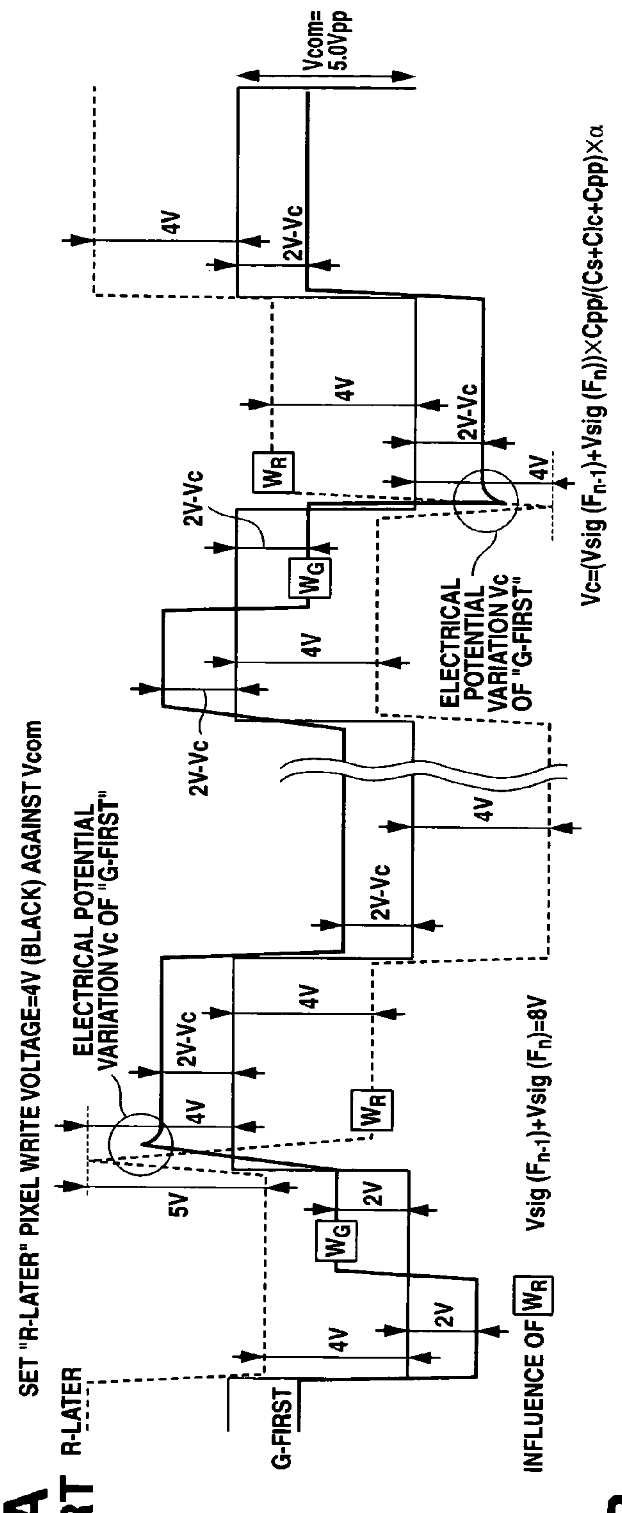
FIG.27A PRIOR ART
FIG. 27A is a view depicting pixel electrical potential waveforms, in which amplitude of a common voltage is set to 5.0V, a write voltage of a pixel G-first is set to 2.0V against the common voltage, and a write voltage of pixel R-later is set to 4.0V against the common voltage, in performing dot inversion driving, taking inter-pixel parasitic capacitance into account.
Figure 27B:
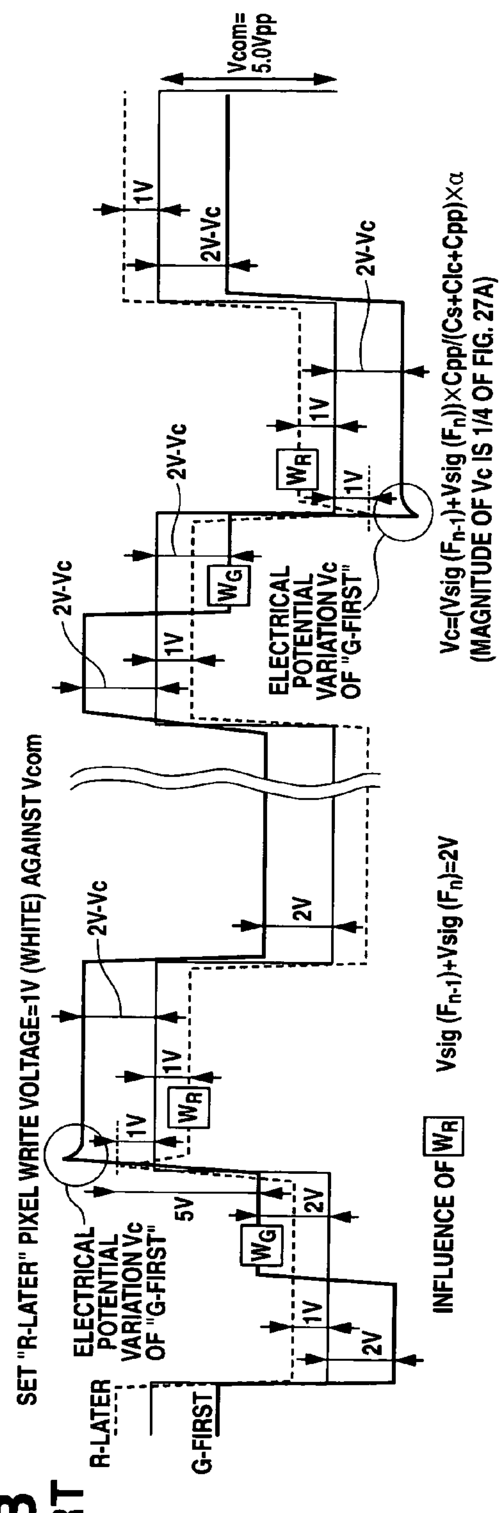
FIG.27B PRIOR ART
FIG. 27B is a view depicting pixel electrical potential waveforms, in which amplitude of a common voltage is set to 5.0V, a write voltage of a pixel G-first is set to 2.0V against the common voltage, and a write voltage of pixel R-later is set to 1.0V against the common voltage, in performing the dot inversion driving, taking inter-pixel parasitic capacitance into account.

FIG. 18A shows the writing order of the video signals Vsigs in pixels 16 in the first field in up-and-down inverse shifting in the gate driver block 22 of the configuration in FIG. 5, and FIG. 18B similarly shows the writing order of the video signals Vsigs in pixels 16 in the second field in up-and-down inverse shifting in the gate driver block.

In up-and-down inverse shifting, since the writing of the video signals Vsigs in each pixel 16 is performed in order in a reversed direction of the gate lines as shown in FIG. 7A, the writing order is as shown in FIG. 18A. Thereby, the voltage leakages occur among pixels due to the inter-pixel parasitic capacitance 204 at locations where a source line is not provided between adjacent pixels, and the electrical potentials of the pixel 16 written earlier are varied under the influence of the electrical potentials of the pixels written later.

After entering the second field, since the writing of the video signals Vsigs for adjacent pixels connected to different source lines is carried out in an order which is reversed with respect to the first field, in accordance with the selection order of the gate lines, the writing is performed as depicted in FIG. 18B. Thereby, also in the second field, the voltage leakages occur among pixels due to the inter-pixel parasitic capacitance 204 at locations where a source line is not provided between adjacent pixels, and the electrical potentials of the pixel 16 written earlier vary under the influence of the electrical potentials of the pixels 16 written later.

However, the pixels 16 whose the electrical potentials vary in the second field differ from the pixels whose electrical potentials vary in the first field. In other words, in the second field, since the writing order of the video signals Vsigs is made contrary to the writing order of the video signals Vsigs in the first field, the writing order in the adjacent pixels 16 is reversed between the first and the second fields. Therefore, the positions of the pixels at which the potential differences occur are made opposite between the first and the second fields, and as a result, the deviations of the pixel potentials are temporally averaged and the display unevenness is reduced.

As mentioned above, by performing the same drive control as described above with respect to the first embodiment, display unevenness can be decreased in a display employing the delta arrangement.

Moreover, since the delta arrangement of the pixels 16 causes the display unevenness to snake (i.e., snaking, or zigzag, vertical stripes in FIG. 16) in comparison with the stripe arrangement of the first embodiment, the delta arrangement produces an effect such that the display unevenness is made even less visible than in the case of the stripe arrangement.

The driving explained above with respect to the modified example of the first embodiment (FIG. 9) enables the snaking of the display unevenness to be complex and therefore causes the vertical stripes to be even more inconspicuous.

It should be understood from the foregoing that the first and second fields are alternated continuously when performing display with the active matrix display device. Thus, the first field described above corresponds to all odd-numbered fields, while the second field described above corresponds to all even-numbered fields. (The order of the first and second fields may be reversed.)

The present invention is not limited to the foregoing embodiments, and various modifications and applications can be made within the concept of the invention.

For instance, if the writing order of the adjacent pixels is changed in every field, the selection order of gate lines G1 to G480 may not follow the orders described in connection with the aforementioned embodiments.

While the embodiments described above have described the case in which the writing orders are switched in every field, almost the same effects may be obtained by switching every two fields (that is, every frame).

Further, switching every k fields (k is an integer of three or more) may be agreeable, but it is preferable for the period to be short.

Here, although the case of a liquid crystal display device in a normally white mode in which the higher the voltages applied to the pixels are, the lower (darker) the transmission factor becomes has described, it should of course be understood that the invention may be applied to the case of a liquid crystal display device in a normally black mode in which the higher the voltages applied to the pixels are, the higher (brighter) the transmission factor becomes.

Moreover, while the example of a liquid crystal for a color display has been described, it goes without saying that the present invention may be applied to a monochrome (black and white) display liquid crystal.

Further, it also goes without saying that the switching device is not limited to a TFT, and a diode, etc., may be usable.

Still further, the numbers of gate lines and the source lines are not limited to the numbers in the example of FIG. 1.

The pixels of the active matrix display device need not necessary be liquid crystals, since any capacitive element experiences the inter-pixel parasitic capacitance, and therefore the present invention may decrease the display unevenness similarly in a display device which is not a liquid crystal display.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. An active matrix display device, comprising:

a display panel, which includes a plurality of scanning lines, a plurality of signal lines, and a plurality of pixels, wherein one signal line is provided for every two pixels arranged along a scanning line direction of the active matrix display, and two pixels which are adjacent to each other along the scanning line direction across one of the signal lines share the signal line and are respectively connected through switching elements to two of the scanning lines that are arranged to extend along the scanning line direction and to be adjacent to each other across the pixel;

a signal line driving circuit which outputs signals, based on information to be displayed, to the plurality of signal lines;

a scanning line driving circuit which selects the plurality of scanning lines; and a control unit which controls an operation of the scanning line driving circuit;

wherein the scanning line driving circuit is configured to handle the two scanning lines that are adjacent to each other across the pixel as a scanning line group, to divide the plurality of scanning lines into a plurality of adjacent scanning line groups, and to select the plurality of scanning lines in first and second consecutive predetermined periods such that (i) the scanning line groups are selected in a same order in the first predetermined period and the second predetermined period, and (ii) within each of the scanning line groups, a selection order of the scanning lines in the second predetermined period is opposite to a selection order of the scanning lines in the first predetermined period.

2. The active matrix display device according to claim 1, wherein the prescribed period is k field periods, where k is an integer and is at least 1.

3. The active matrix display device according to claim 1, wherein the signal line driving circuit outputs signals to the plurality of signal lines in accordance with a selection order of the scanning lines by the scanning line driving circuit.

4. The active matrix display device according to claim 1, wherein the plurality of pixels of the display panel are arranged in a strip arrangement.

5. The active matrix display device according to claim 1, wherein the plurality of pixels of the display panel are arranged in a delta arrangement.

6. An active matrix display device, comprising:

a display panel which includes a plurality of scanning lines arranged along a row direction, a plurality of signal lines arranged along a column direction, a plurality of pixel electrodes arranged in a two-dimensional matrix along the row and column directions, and a plurality of thin film transistors respectively connected to the pixel electrodes; and a scanning line driving circuit which selects the plurality of scanning lines;

wherein the display panel comprises:

a first pixel electrode, a second pixel electrode, and a third pixel electrode arranged adjacent to each other in a row;

a first scanning line and a second scanning line adjacent to each other in a column direction across the first pixel electrode, the second pixel electrode, and the third pixel electrode;

a first thin film transistor comprising a first gate electrode, a first source electrode, and a first drain electrode, having the first gate electrode connected to the first scanning line, and having the first drain electrode connected to the first pixel electrode;

a second thin film transistor comprising a second gate electrode, a second source electrode, and a second drain electrode, having the second gate electrode connected to the second scanning line, and having the second drain electrode connected to the second pixel electrode;

a third thin film transistor comprising a third gate electrode, a third source electrode, and a third drain electrode, having the third gate electrode connected to the first scanning line, and having the third drain electrode connected to the third pixel electrode;

a first signal line connected to the first source electrode of the first thin film transistor and the second source electrode of the second thin film transistor; and a second signal line connected to the third source electrode of the third thin film transistor;

wherein the first signal line is arranged between the first pixel electrode and the second pixel electrode; and wherein the scanning line driving circuit is configured to handle the first scanning line and the second scanning line as a scanning line group, to divide the plurality of scanning lines into a plurality of adjacent scanning line groups, and to select the plurality of scanning lines in first and second consecutive predetermined periods such that (i) the scanning line groups are selected in a same order in the first predetermined period and the second predetermined period, and (ii) within each of the scanning line groups, a selection order of the scanning lines in the second predetermined period is opposite to a selection order of the scanning lines in the first predetermined period.

7. The active matrix display device of claim 6, further comprising a signal line driving circuit which outputs signals based on information to be displayed to the first signal line and the second signal line.

8. The active matrix display device of claim 1, wherein the scanning line driving circuit is configured to select the plurality of scanning lines in two adjacent scanning line groups such that, within one said predetermined period, the selection order of the scanning lines in one of the two scanning line groups is opposite to the selection order of the scanning lines in the other of the two scanning line groups.

9. The active matrix display device of claim 6, wherein the scanning line driving circuit is configured to select the plurality of scanning lines in two adjacent scanning line groups such that, within one said predetermined period, the selection order of the scanning lines in one of the two scanning line groups is opposite to the selection order of the scanning lines in the other of the two scanning line groups.

10. The active matrix display device of claim 6, wherein the prescribed period is k field periods, where k is an integer and is at least 1.

11. The active matrix display device according to claim 6, wherein:

in one of two adjacent rows of the display panel, the second pixel electrode and the third pixel electrode are arranged between the first signal line and the second signal line; and in the other of the two adjacent rows of the display panel, the first pixel electrode and the third pixel electrode are arranged between the first signal line and the second signal line.

* * * * *